US012641812B2

(12) United States Patent
Pan et al.

(10) Patent No.: US 12,641,812 B2
(45) Date of Patent: *May 26, 2026

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: Chen-Wei Pan, Zhubei City (TW); Jen-Chih Hsueh, Kaohsiung City (TW); Li-Feng Chu, Hsinchu City (TW); Chih-Teng Liao, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 243 days.

This patent is subject to a terminal disclaimer.

(21) Appl. No.: 18/231,433

(22) Filed: Aug. 8, 2023

(65) Prior Publication Data

US 2023/0378327 A1 Nov. 23, 2023

Related U.S. Application Data

(63) Continuation of application No. 17/239,225, filed on Apr. 23, 2021, now Pat. No. 11,824,103.

(51) Int. Cl.
*H10D 30/01* (2025.01)
*H01L 21/311* (2006.01)
(Continued)

(52) U.S. Cl.
CPC ...... *H10D 30/024* (2025.01); *H01L 21/31116* (2013.01); *H10D 30/62* (2025.01);
(Continued)

(58) Field of Classification Search
CPC .. H10D 30/024; H10D 30/62; H10D 30/6211; H10D 30/6219; H10D 64/017;
(Continued)

(56) References Cited

U.S. PATENT DOCUMENTS 9,443,979 B2 * 9/2016 Park ..................... H10D 64/518
10,192,973 B2 * 1/2019 Park .................. H01L 21/28114
(Continued)

FOREIGN PATENT DOCUMENTS

| CN | 109427588 A | 3/2019 |
| TW | 201824447 A | 7/2018 |
| TW | 202105600 A | 2/2021 |

OTHER PUBLICATIONS

Notice of Allowance issued in U.S. Appl. No. 17/239,225, dated Jul. 17, 2023.

(Continued)

*Primary Examiner* — Earl N Taylor
(74) *Attorney, Agent, or Firm* — STUDEBAKER BRACKETT PLLC

(57) ABSTRACT

In a method of manufacturing a semiconductor device, a fin structure protruding from an isolation insulating layer disposed over a substrate is formed, a sacrificial gate dielectric layer is formed over the fin structure, a polysilicon layer is formed over the sacrificial gate dielectric layer, a mask pattern is formed over the polysilicon layer, and the polysilicon layer is patterned into a sacrificial gate electrode using the mask pattern as an etching mask. The sacrificial gate electrode has a narrow portion above a level of a top of the fin structure such that a width of the sacrificial gate electrode decreases, takes a local minimum, and then increases from the top of the fin structure.

20 Claims, 22 Drawing Sheets

(51) Int. Cl.

| | |
|---|---|
| *H10D 30/62* | (2025.01) |
| *H10D 64/01* | (2025.01) |
| *H10D 64/27* | (2025.01) |
| *H10D 84/01* | (2026.01) |
| *H10D 84/03* | (2025.01) |

(52) U.S. Cl.
CPC ..... *H10D 30/6211* (2025.01); *H10D 30/6219* (2025.01); *H10D 64/017* (2025.01); *H10D 64/518* (2025.01); *H10D 84/013* (2025.01); *H10D 84/0147* (2025.01); *H10D 84/0151* (2025.01); *H10D 84/0158* (2025.01); *H10D 84/038* (2025.01)

(58) Field of Classification Search
CPC .............. H10D 64/518; H10D 84/013; H10D 84/0147; H10D 84/0151; H10D 84/0158; H10D 84/038; H10D 30/797; H10D 62/822; H10D 84/0193; H10D 84/0172; H10D 84/853; H01L 21/31116; H01L 21/28114; H01L 21/32137; H01L 29/66795; H01L 21/823418; H01L 21/823431; H01L 21/823468; H01L 21/823481; H01L 29/41791; H01L 29/7851
See application file for complete search history.

(56) References Cited

U.S. PATENT DOCUMENTS

| | | | | |
|---|---|---|---|---|
| 10,522,682 B2 * | 12/2019 | Yoon | .................. | H10D 30/6219 |
| 11,824,103 B2 * | 11/2023 | Pan | ..................... | H10D 84/038 |
| 2008/0230832 A1 * | 9/2008 | Cho | ................... | H10D 30/6211 |
| | | | | 257/E21.219 |
| 2012/0235233 A1 * | 9/2012 | Nowak | ................ | H10D 84/038 |
| | | | | 438/151 |
| 2015/0187946 A1 * | 7/2015 | Park | ..................... | H10D 64/518 |
| | | | | 257/288 |
| 2016/0204264 A1 * | 7/2016 | You | ....................... | H10D 64/518 |
| | | | | 257/401 |
| 2016/0359017 A1 * | 12/2016 | Park | ..................... | H10D 64/017 |
| 2017/0005165 A1 * | 1/2017 | Chen | ................... | H10D 64/518 |
| 2017/0053913 A1 * | 2/2017 | Min | ................... | H10D 84/834 |
| 2017/0110576 A1 * | 4/2017 | Kim | ................... | H10D 30/792 |
| 2017/0117192 A1 * | 4/2017 | Min | ..................... | H10D 84/038 |
| 2017/0133376 A1 * | 5/2017 | Glass | .................. | H10D 62/115 |
| 2018/0337095 A1 * | 11/2018 | Chen | ................... | H10D 30/024 |
| 2019/0088779 A1 * | 3/2019 | Kim | ..................... | H10D 30/792 |
| 2019/0334016 A1 * | 10/2019 | Wu | ....................... | H10D 64/017 |
| 2020/0058790 A1 * | 2/2020 | Chiang | ............ | H01L 21/32134 |
| 2020/0119000 A1 | 4/2020 | Wang et al. | | |
| 2022/0052159 A1 * | 2/2022 | Wang | ................. | H10D 84/038 |
| 2022/0344497 A1 * | 10/2022 | Pan | ................... | H10D 30/6219 |
| 2023/0378327 A1 * | 11/2023 | Pan | ..................... | H10D 30/024 |
| 2024/0088269 A1 | 3/2024 | Wu et al. | | |
| 2025/0120138 A1 | 4/2025 | Yang et al. | | |

OTHER PUBLICATIONS

Final Office Action issued in U.S. Appl. No. 17/239,225, dated Feb. 14, 2023.

Non-Final Office Action issued in U.S. Appl. No. 17/239,225, dated Aug. 18, 2022.

* cited by examiner

METHOD OF MANUFACTURING A SEMICONDUCTOR DEVICE AND A SEMICONDUCTOR DEVICE

RELATED APPLICATION(S)

This application is a continuation of U.S. patent application Ser. No. 17/239,225 filed Apr. 23, 2021, the entire contents of which is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (FinFET) and a gate-all-around (GAA) FET. In a FinFET, a gate electrode is adjacent to three side surfaces of a channel region with a gate dielectric layer interposed therebetween. A gate electrode of a FinFET includes one of more layers of metallic material formed by a gate replacement technology.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 2:
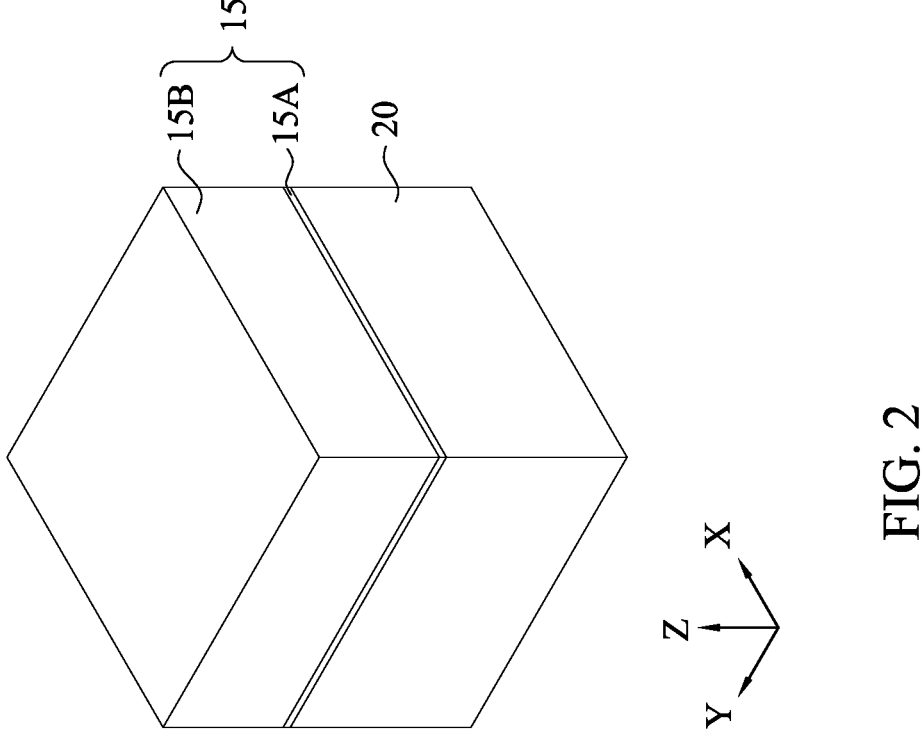
FIG. 2 shows one of the stages of a sequential process for manufacturing a FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

In a gate replacement technology, a sacrificial gate structure including a sacrificial gate electrode (made of, for example, polysilicon) is first formed over a channel region and subsequently is replaced with a metal gate structure. In metal gate FinFETs, device performance is affected by a metal gate profile (shape) design, and the metal gate profile is often dependent on the profile of a sacrificial gate electrode. In some FinFET devices, after the gate replacement process to form a metal gate structure, an upper portion of the metal gate structure is recessed and a cap insulating layer is formed over the recessed gate structure to secure an isolation region between the metal gate electrode and adjacent conductive contacts. Further, in advanced FinFET devices, various FETs (n-channel and p-channel FETs) with different threshold voltages are fabricated in one device and FETs may have different metal (e.g., work function adjustment metals) structures. Gate recess etching to form a gate cap may be affected by the metal structures and it is desirable to recess the metal gate structure to a desired level regardless of the metal structures. In the present disclosure, a method of controlling heights of the recessed metal gate structure by adjusting a profile (shape) of the sacrificial gate electrode is provided.

FIGS. 1-16 show a sequential process for manufacturing an FET device according to an embodiment of the present disclosure. It is understood that additional operations can be provided before, during, and after processes shown by FIGS. 1-16, and some of the operations described below can be replaced or eliminated, for additional embodiments of the method. The order of the operations/processes may be interchangeable.

Figure 1:
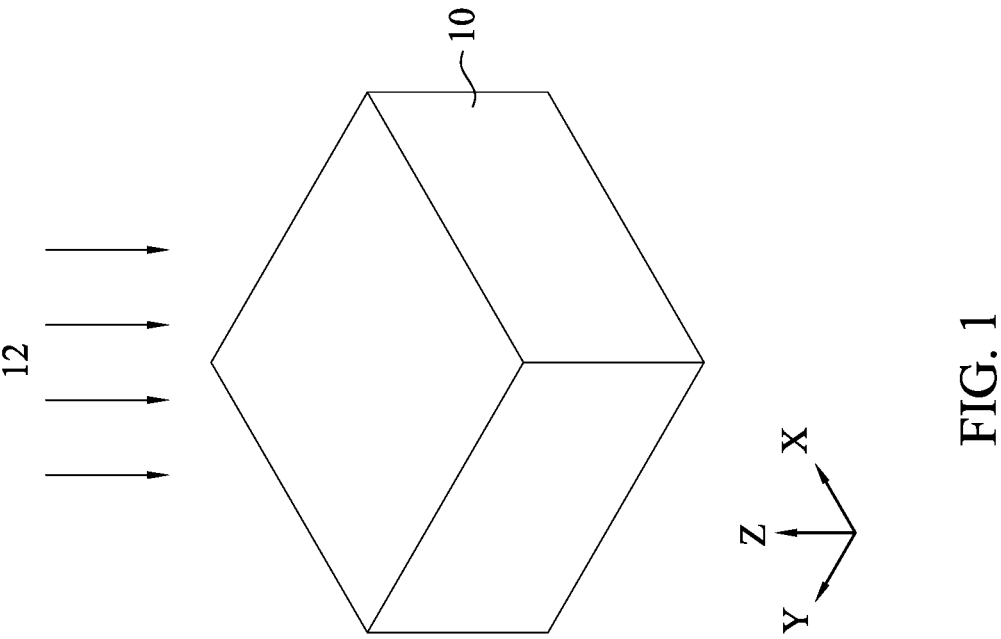
FIG. 1 shows one of the stages of a sequential process for manufacturing a FET device according to an embodiment of the present disclosure.

As shown in FIG. 1, impurity ions (dopants) 12 are implanted into a silicon substrate 10 to form a well region. The ion implantation is performed to prevent a punch-through effect.

In one embodiment, substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The substrate 10 may include various regions that have been suitably doped with impurities (e.g., p-type or n-type conductivity). The dopants 12 are, for example boron (BF$_2$) for an n-type Fin FET and phosphorus for a p-type Fin FET.

In FIG. 2, a mask layer 15 is formed over the substrate 10. In some embodiments, the mask layer 15 includes a first mask layer 15A and a second mask layer 15B. In some embodiments, the first mask layer 15A is made of silicon nitride and the second mask layer 15B is made of a silicon oxide. In other embodiments, the first mask layer 15A is made of silicon oxide and the second mask layer 15B is made of silicon nitride (SiN). The first and second mask layers are formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Figure 3:
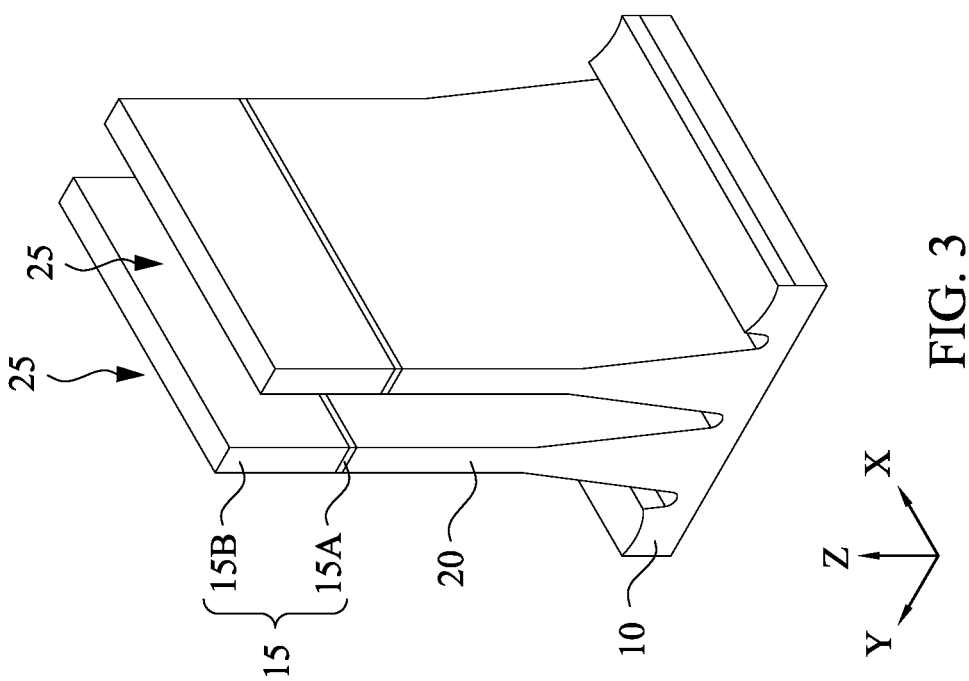
FIG. 3 shows one of the stages of a sequential process for manufacturing a FET device according to an embodiment of the present disclosure.

Next, as shown in FIG. 3, the substrate 10 is patterned by using the patterned mask layer 15 into fin structures 25 extending in the X direction. In FIG. 3, two fin structures 25 are arranged in the Y direction. But the number of the fin structures is not limited to two, and may be as small as one and three or more. In some embodiments, one or more dummy fin structures are formed on both sides of the fin structures 25 to improve pattern fidelity in the patterning operations.

The fin structures 25 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

After the fin structure is formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the fin structures 25 is exposed from the insulating material layer 30 as shown in FIG. 4.

Figure 4:
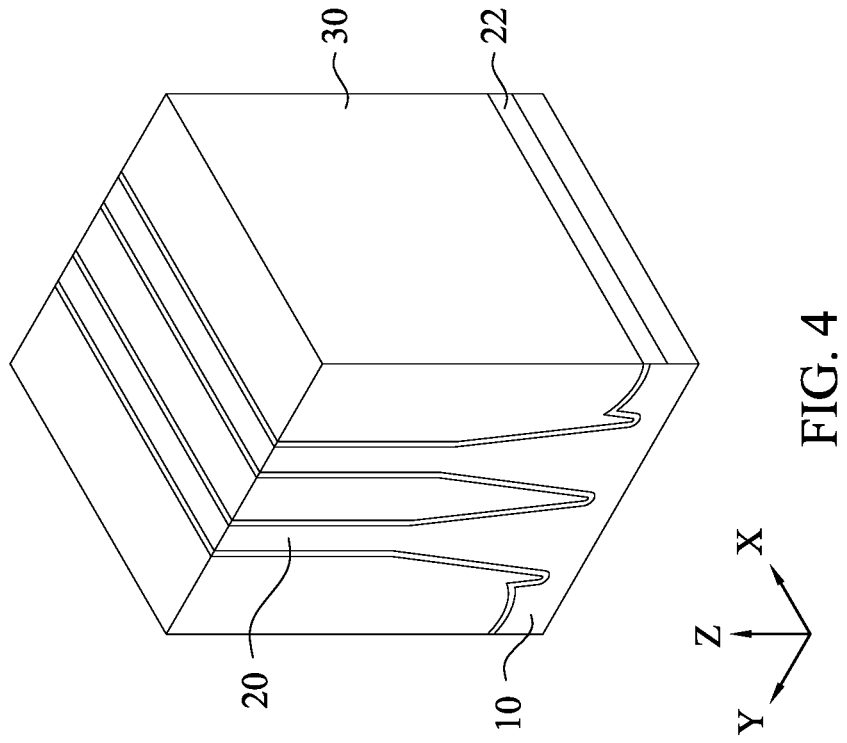
FIG. 4 shows one of the stages of a sequential process for manufacturing a FET device according to an embodiment of the present disclosure.

In some embodiments, one or more liner layers 22 are formed over the structure of FIG. 3 before forming the insulating material layer 40, as shown FIG. 4. The liner layer 22 includes one or more of silicon nitride, SiON, SiCN, SiOCN, and silicon oxide.

Figure 5:
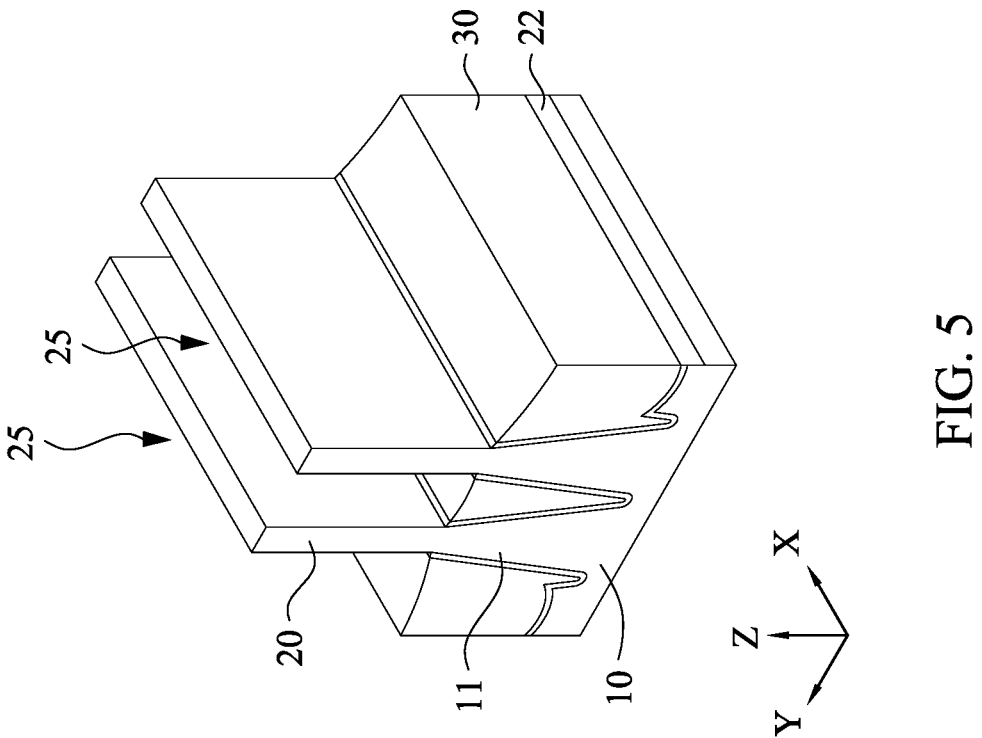
FIG. 5 shows one of the stages of a sequential process for manufacturing a FET device according to an embodiment of the present disclosure.

Then, as shown in FIG. 5, the insulating material layer 30 is recessed to form an isolation insulating layer 30 so that the upper portions of the fin structures 20 are exposed. With this operation, the fin structures 25 are electrically separated from each other by the isolation insulating layer 30, which is also called a shallow trench isolation (STI). The lower portion 11 of the fin structure is embedded in the isolation insulating layer 30.

Figure 6:
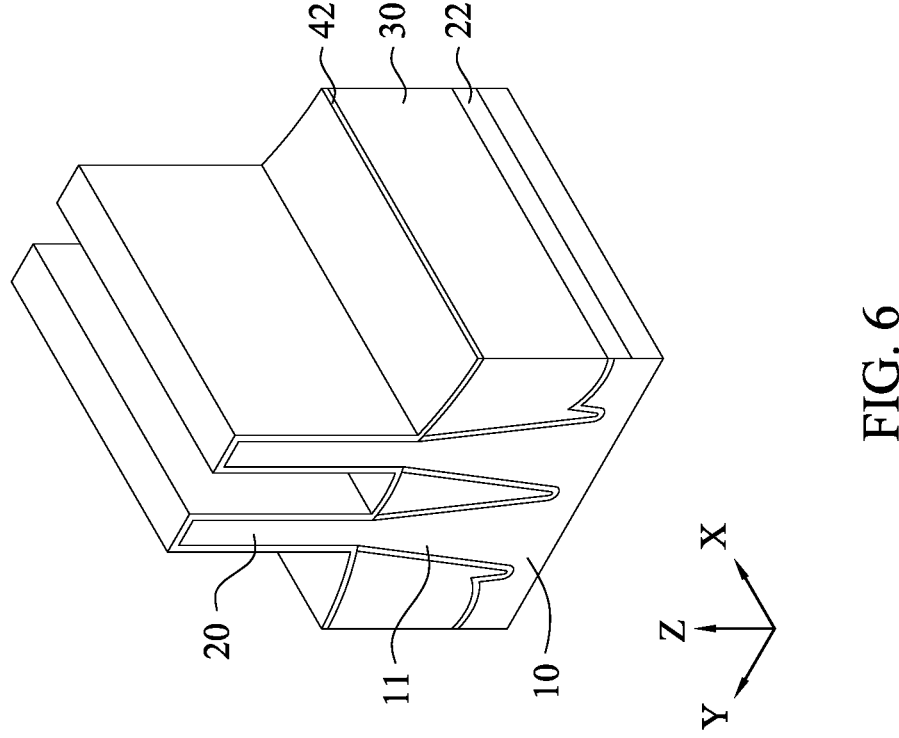
FIG. 6 shows one of the stages of a sequential process for manufacturing a FET device according to an embodiment of the present disclosure.

After the isolation insulating layer 30 is formed, a sacrificial gate dielectric layer 42 is formed, as shown in FIG. 6. The sacrificial gate dielectric layer 42 includes one or more layers of insulating material, such as a silicon oxide-based material. In one embodiment, silicon oxide formed by CVD is used. The thickness of the sacrificial gate dielectric layer 42 is in a range from about 1 nm to about 5 nm in some embodiments.

Figure 7:
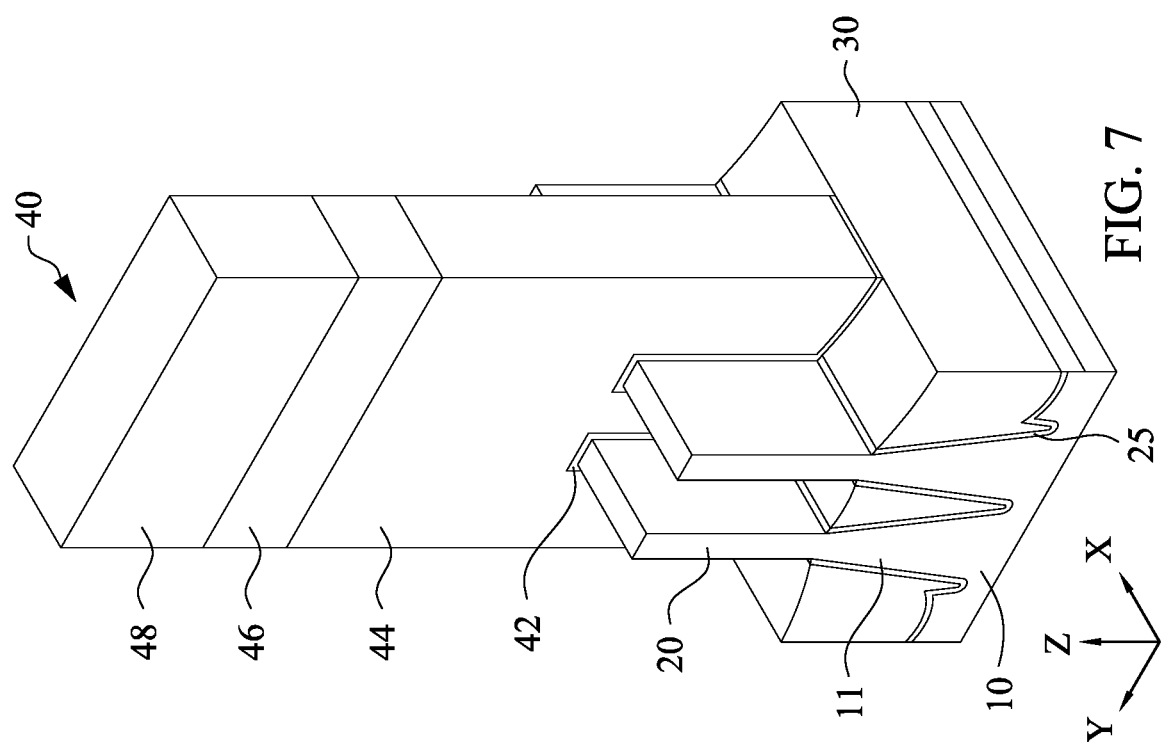
FIG. 7 shows one of the stages of a sequential process for manufacturing a FET device according to an embodiment of the present disclosure.

FIG. 7 illustrates a structure after a sacrificial gate structure 40 is formed over the exposed fin structures 25. The sacrificial gate structure includes a sacrificial gate electrode 44 and the sacrificial gate dielectric layer 42. The sacrificial gate structure 40 is formed over a portion of the fin structure which is to be a channel region. The sacrificial gate structure 40 is formed by first blanket depositing the sacrificial gate dielectric layer 42 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 46 and a silicon oxide mask layer 48.

Next, a patterning operation is performed on the mask layer and sacrificial gate electrode layer is patterned into the sacrificial gate structure 40, as shown in FIG. 7. The patterning operations of sacrificial gate structure 40 will be explained below in more detail.

The sacrificial gate structure 40 includes the sacrificial gate dielectric layer 42, the sacrificial gate electrode layer 44 (e.g., poly silicon), the pad SiN layer 46 and the silicon oxide mask layer 48 in some embodiments. By patterning the sacrificial gate structure 40, the upper portions of the fin structures 20 are partially exposed on opposite sides of the sacrificial gate structure 40, thereby defining source/drain (S/D) regions, as shown in FIG. 7. In this disclosure, a source and a drain are interchangeably used and the structures thereof are substantially the same. In FIG. 7, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 8:
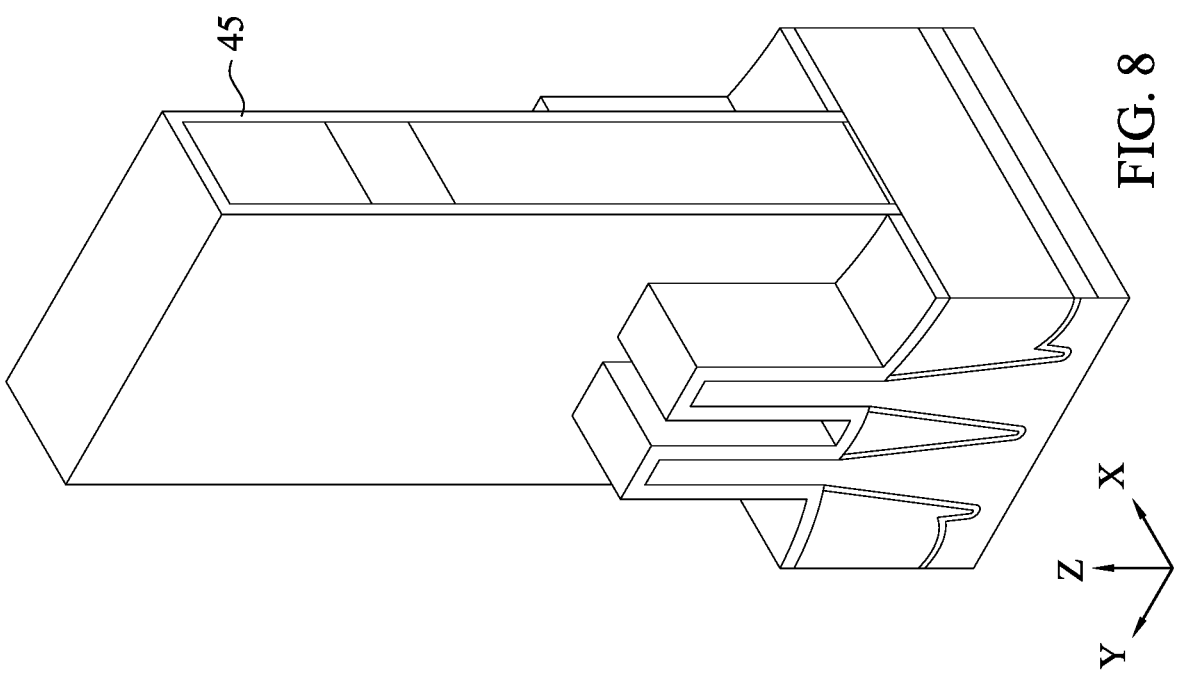
FIG. 8 shows one of the stages of a sequential process for manufacturing a FET device according to an embodiment of the present disclosure.

After the sacrificial gate structure 40 is formed, a blanket layer 45 of an insulating material for sidewall spacers 45 is conformally formed by using CVD or other suitable methods, as shown in FIG. 8. The blanket layer 45 is deposited in a conformal manner so that it is formed to have substantially equal thicknesses on vertical surfaces, such as the sidewalls, horizontal surfaces, and the top of the sacrificial gate structure. In some embodiments, the blanket layer 45 is deposited to a thickness in a range from about 2 nm to about 10 nm. In one embodiment, the insulating material of the blanket layer 45 is a silicon nitride-based material, such as SiN, SiON, SiOCN or SiCN and combinations thereof.

Figure 9:
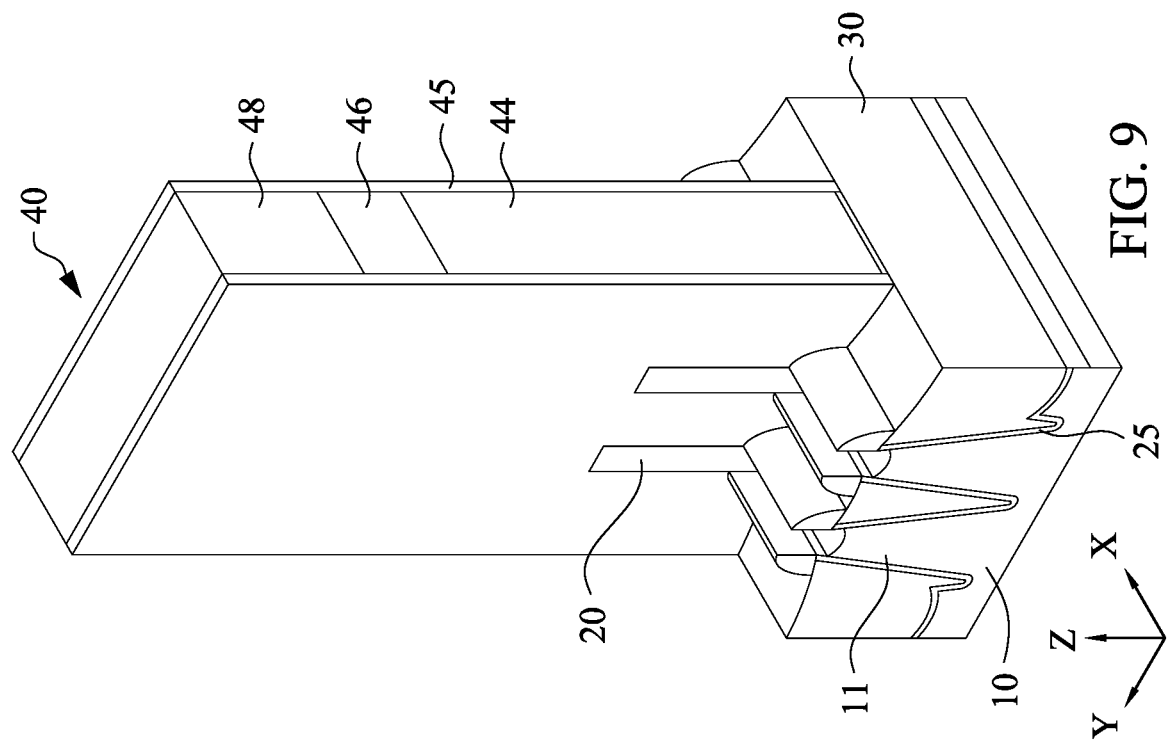
FIG. 9 shows one of the stages of a sequential process for manufacturing a FET device according to an embodiment of the present disclosure.

Further, as shown in FIG. 9, sidewall spacers 45 are formed on opposite sidewalls of the sacrificial gate structures, and subsequently, the fin structures of the S/D regions are recessed down below the upper surface of the isolation insulating layer 30. After the blanket layer 45 is formed, anisotropic etching is performed on the blanket layer 45 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 48 may be exposed from the sidewall spacers. In some embodiments, isotropic etching may be subsequently performed to remove the insulating material from the upper portions of the S/D region of the exposed fin structures 25.

Subsequently, the fin structures of the S/D regions are recessed down below the upper surface of the isolation insulating layer 30, by using dry etching and/or wet etching. As shown in FIG. 9, the sidewall spacers 45 formed on the S/D regions of the exposed fin structures (fin sidewalls) partially remain. In other embodiments, however, the sidewall spacers 45 formed on the S/D regions of the exposed fin structures are fully removed. In case of a GAA FET, inner spacers are formed after the recessing the S/D regions.

Figure 10:
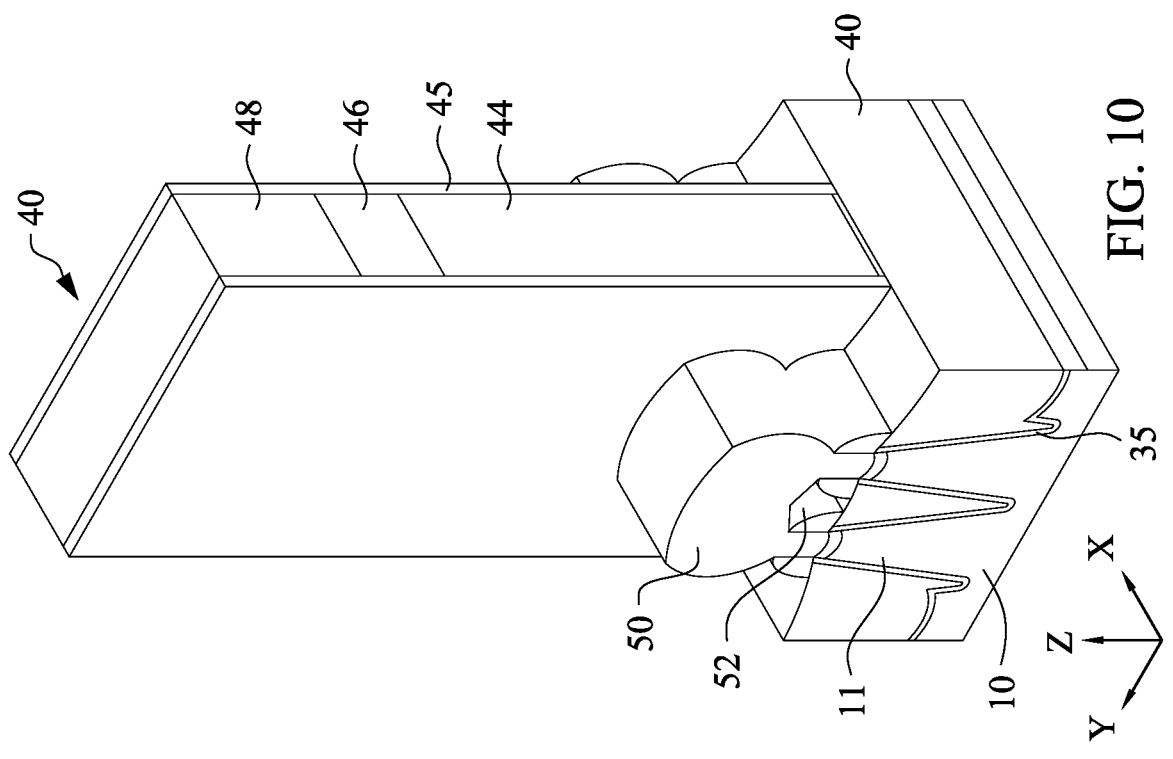
FIG. 10 shows one of the stages of a sequential process for manufacturing a FET device according to an embodiment of the present disclosure.

Subsequently, as shown in FIG. 10, source/drain (S/D) epitaxial layers 50 are formed. The S/D epitaxial layer 50 includes one or more layers of Si, SiP, SiC and SiCP for an n-channel FET or Si, SiGe, Ge, GeSn and SiGeSn for a p-channel FET. The S/D layers 50 are formed by an epitaxial growth method using CVD, ALD or molecular beam epitaxy (MBE).

As shown in FIG. 10, the S/D epitaxial layers grow from the recessed fin structures respectively. The grown epitaxial layers merge above the isolation insulating layer and form a void 52 in some embodiments.

Figure 11:
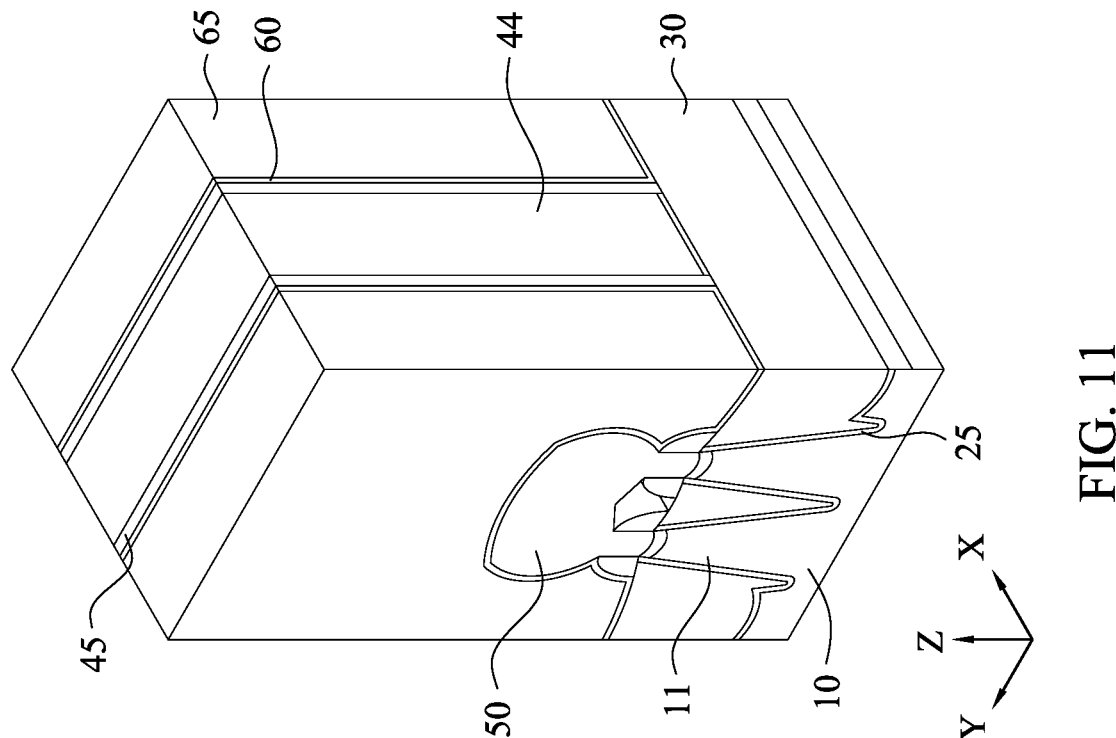
FIG. 11 shows one of the stages of a sequential process for manufacturing a FET device according to an embodiment of the present disclosure.

Subsequently, an insulating liner layer 60, as an etch stop layer, is formed and then an interlayer dielectric (ILD) layer 65 is formed, as shown in FIG. 11. The insulating liner layer 60 is made of a silicon nitride-based material, such as SiN, and functions as a contact etch stop layer in the subsequent etching operations. The materials for the ILD layer 65 include compounds comprising Si, O, C and/or H, such as silicon oxide, SiCOH and SiOC. Organic materials, such as polymers, may be used for the ILD layer 65. After the ILD layer 65 is formed, a planarization operation, such as CMP, is performed, so that the top portion of the sacrificial gate electrode layer 44 is exposed, as shown in FIG. 11.

Figure 12:
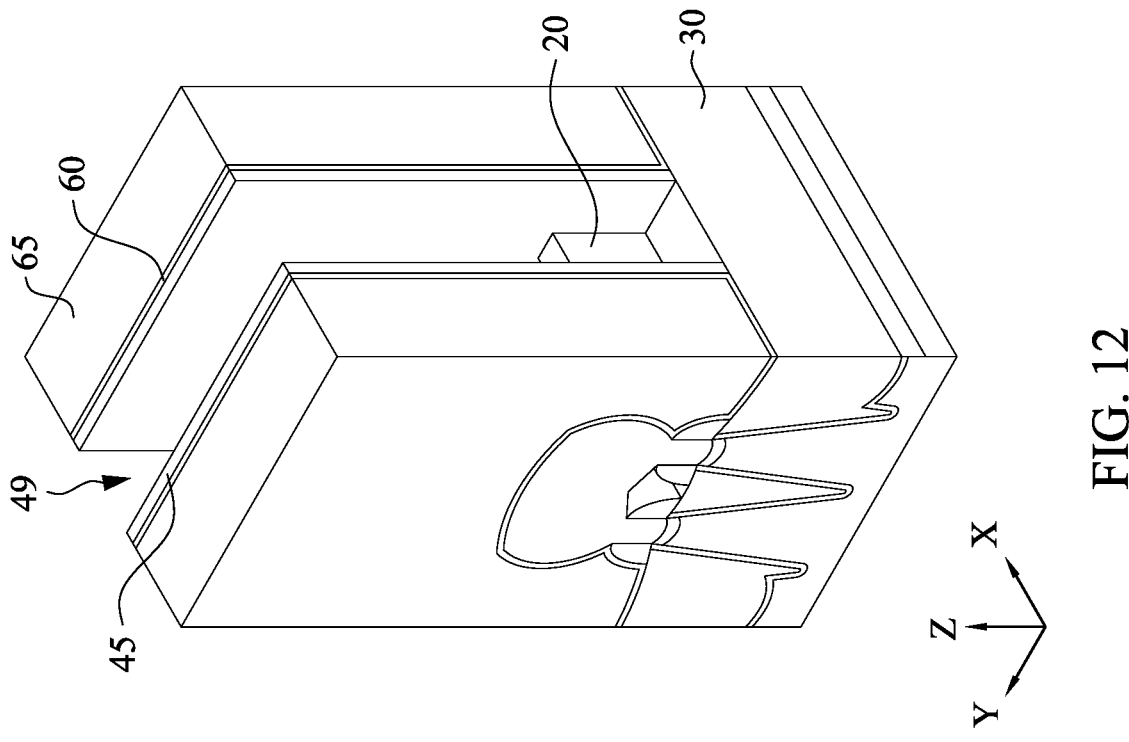
FIG. 12 shows one of the stages of a sequential process for manufacturing a FET device according to an embodiment of the present disclosure.

Next, as shown in FIG. 12, the sacrificial gate electrode layer 44 and sacrificial gate dielectric layer 42 are removed, thereby exposing the fin structures in a gate space 49. The ILD layer 65 protects the S/D structures 50 during the removal of the sacrificial gate structures. The sacrificial gate structures can be removed using plasma dry etching and/or wet etching. When the sacrificial gate electrode layer 44 is polysilicon and the ILD layer 65 is silicon oxide, a wet etchant such as a TMAH solution can be used to selectively remove the sacrificial gate electrode layer 44. The sacrificial gate dielectric layer 42 is thereafter removed using plasma dry etching and/or wet etching.

Figure 13:
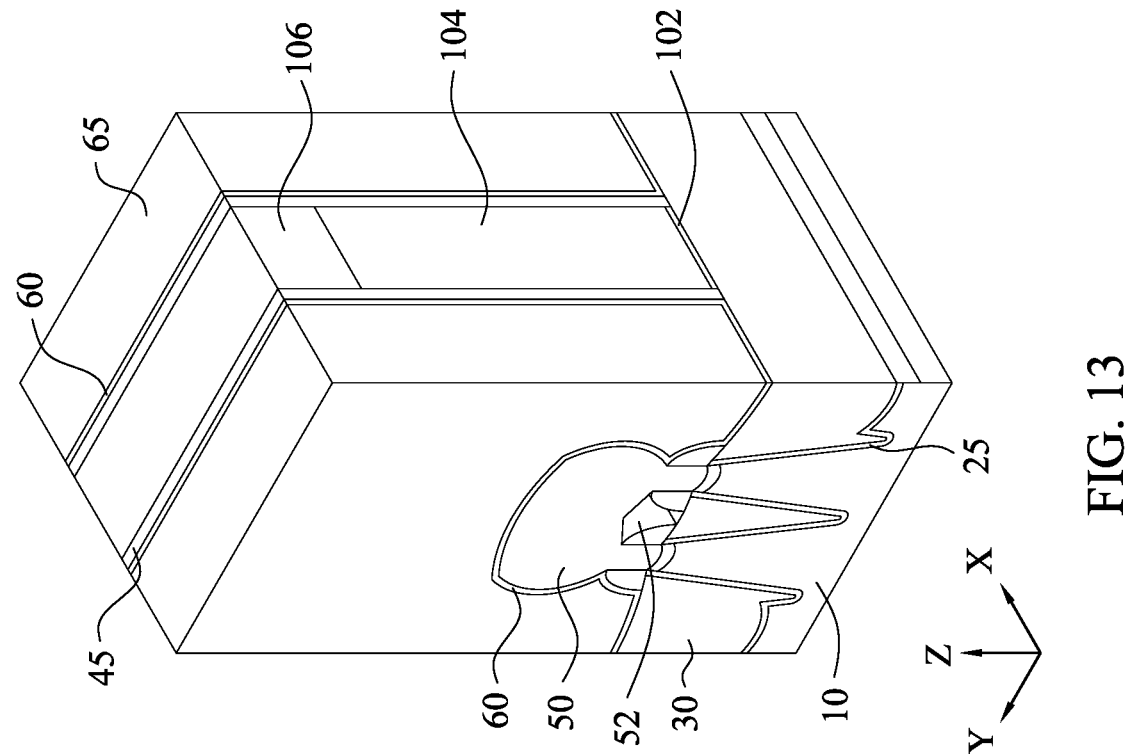
FIG. 13 shows one of the stages of a sequential process for manufacturing a FET device according to an embodiment of the present disclosure.

After the sacrificial gate structures are removed, a gate dielectric layer 102 is formed around the exposed fin structures 20, and a gate electrode layer 104 is formed on the gate dielectric layer 102, as shown in FIG. 13.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 includes an interfacial layer formed between the channel layers and the dielectric material.

The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness on the channel regions. The thickness of the gate dielectric layer 102 is in a range from about 1 nm to about 6 nm in one embodiment.

The gate electrode layer 104 is formed on the gate dielectric layer 102. The gate electrode 104 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 104 may be formed by CVD, ALD, electro-plating, or other suitable method. The gate electrode layer is also deposited over the upper surface of the ILD layer 65. The gate dielectric layer and the gate electrode layer formed over the ILD layer 65 are then planarized by using, for example, CMP, until the top surface of the ILD layer 65 is revealed.

After the planarization operation, the gate electrode layer 104 is recessed and a cap insulating layer 106 is formed over the recessed gate electrode 104, as shown in FIG. 13. The cap insulating layer includes one or more layers of a silicon nitride-based material, such as SiN. The cap insulating layer 106 can be formed by depositing an insulating material followed by a planarization operation.

In certain embodiments of the present disclosure, one or more work function adjustment layers (not shown) are interposed between the gate dielectric layer 102 and the gate electrode 104. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 14:
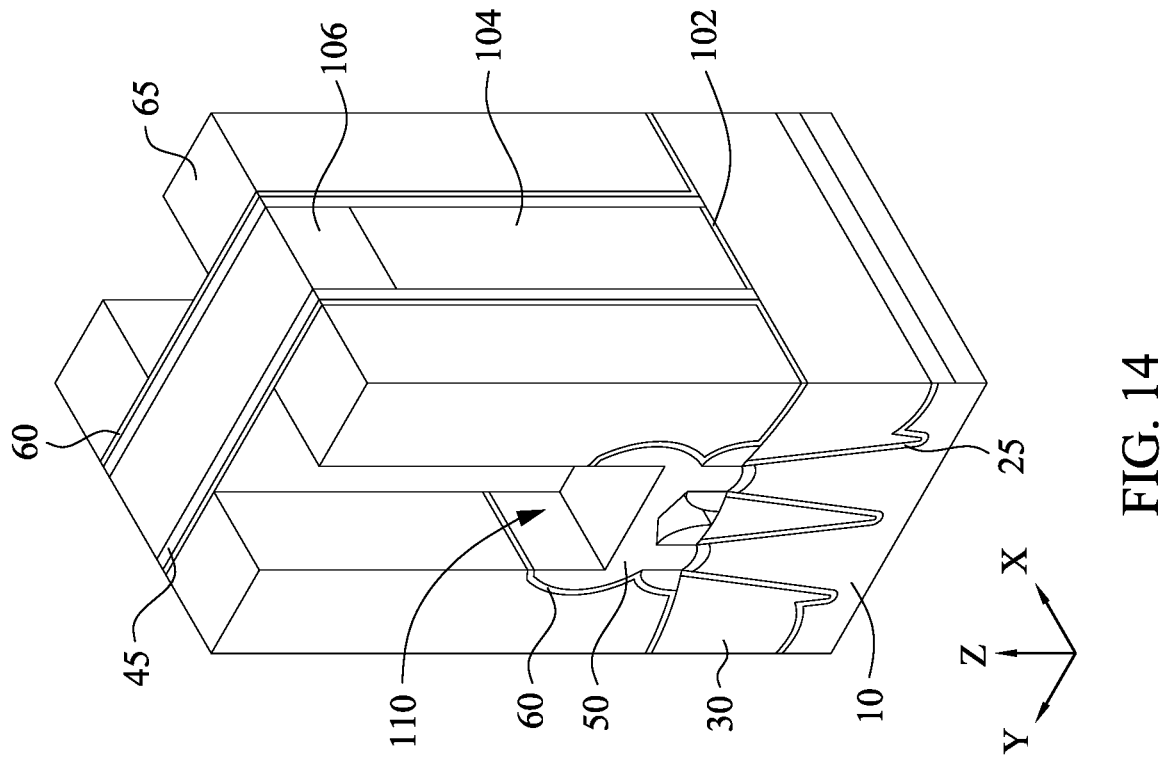
FIG. 14 shows one of the stages of a sequential process for manufacturing a FET device according to an embodiment of the present disclosure.

Subsequently, contact holes 110 are formed in the ILD layer 65 by using dry etching, as shown in FIG. 14. In some embodiments, the upper portion of the S/D epitaxial layer 50 is etched.

Figure 16:
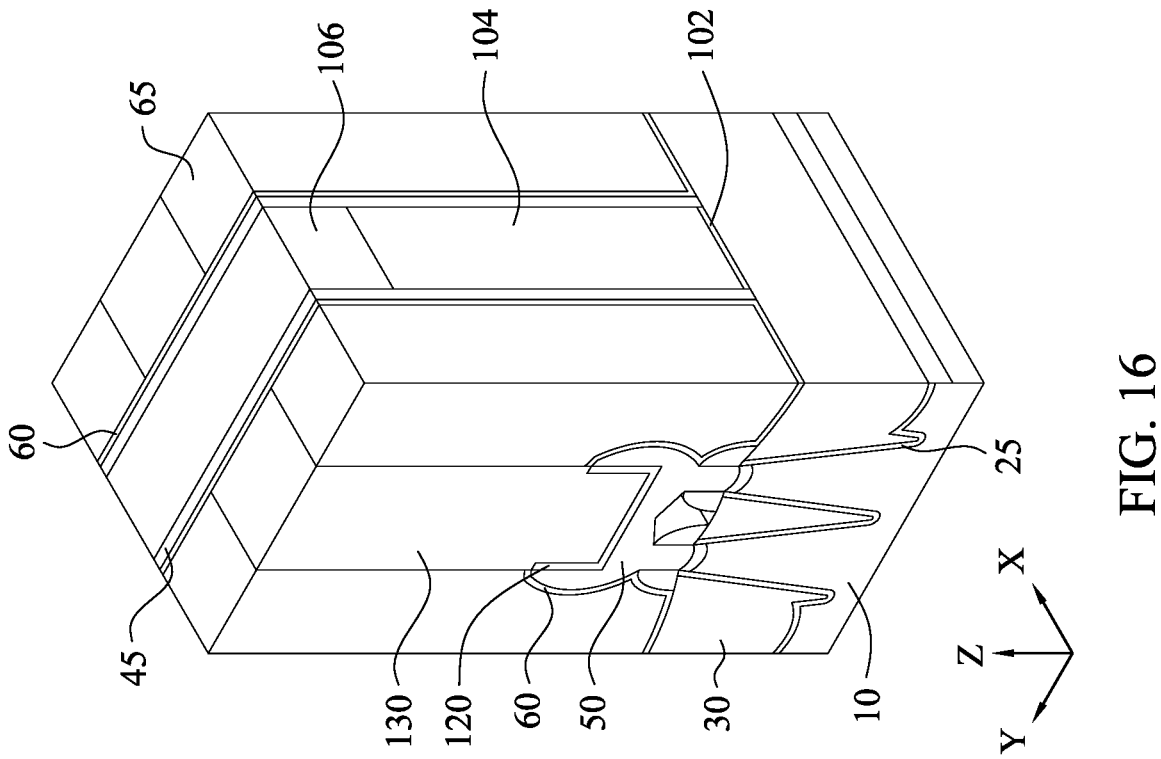
FIG. 16 shows one of the stages of a sequential process for manufacturing a FET device according to an embodiment of the present disclosure.
Figure 15:
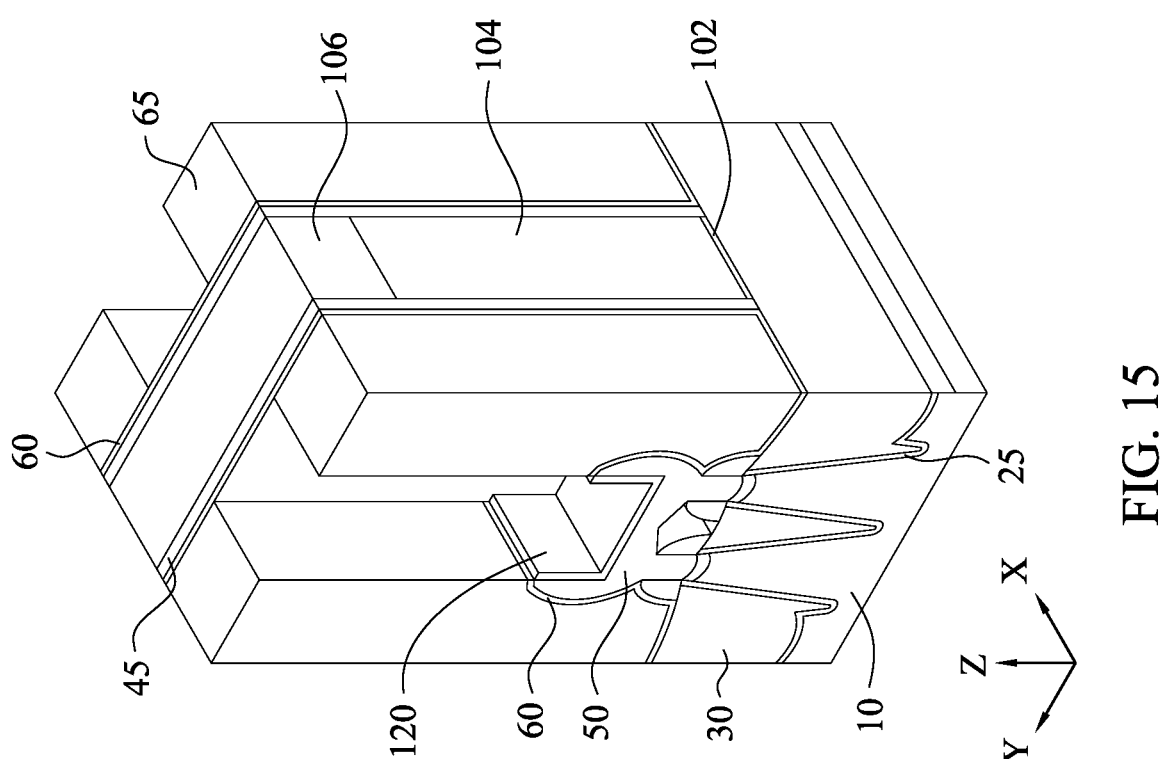
FIG. 15 shows one of the stages of a sequential process for manufacturing a FET device according to an embodiment of the present disclosure.

A silicide layer 120 is formed over the S/D epitaxial layer 50, as shown in FIG. 15. The silicide layer includes one or more of WSi, CoSi, NiSi, TiSi, MoSi and TaSi. Then, a conductive material 130 is formed in the contact holes as shown in FIG. 16. The conductive material 130 includes one or more of Co, Ni. W, Ti, Ta, Cu, Al, TiN and TaN.

It is understood that the FinFETs undergo further CMOS processes to form various features such as contacts/vias, interconnect metal layers, dielectric layers, passivation layers, etc.

FIGS. 17A-21C show a sequential process for a gate replacement operation according to an embodiment of the present disclosure. It is understood that additional operations can be provided before, during, and after processes shown by FIGS. 17A-21C, and some of the operations described below can be replaced or eliminated, for additional embodiments of the method. The order of the operations/processes may be interchangeable.

Figure 17B:
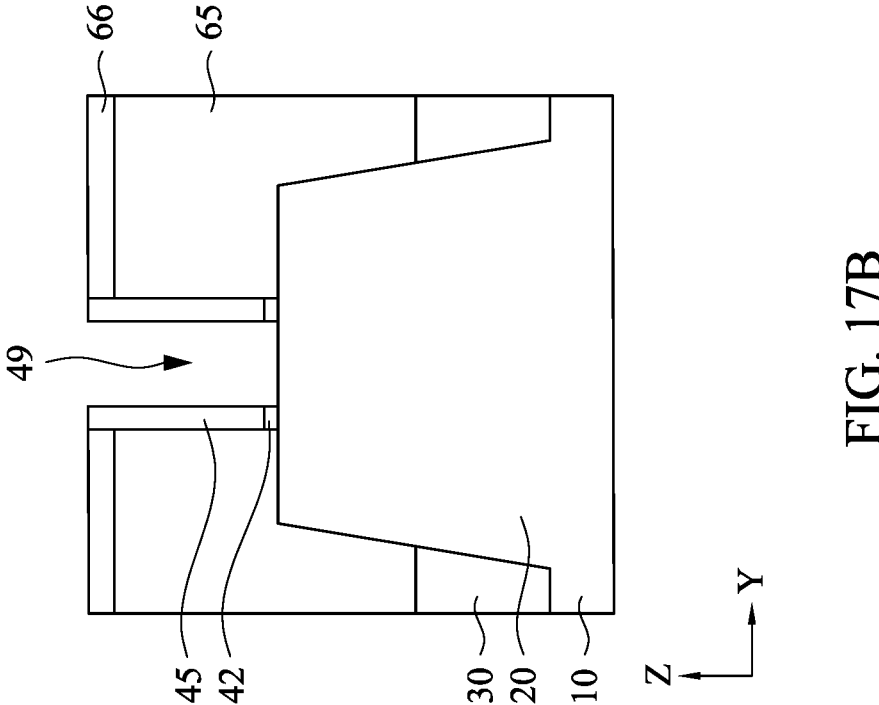
FIGS. 17A, 17B, 17C and 17D show various stages of a sequential process for a gate replacement operation according to an embodiment of the present disclosure.
Figure 17A:
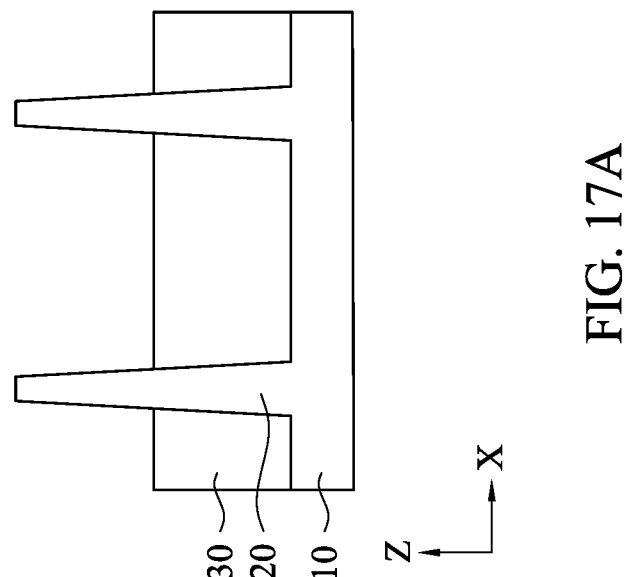
Figure 17D:
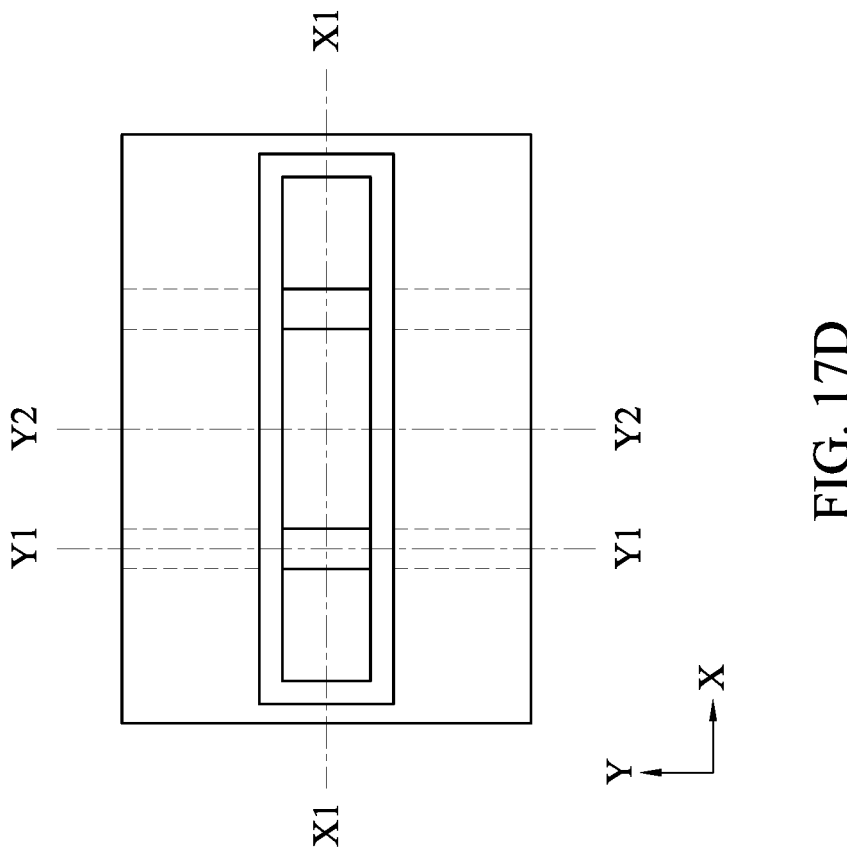
Figure 17C:
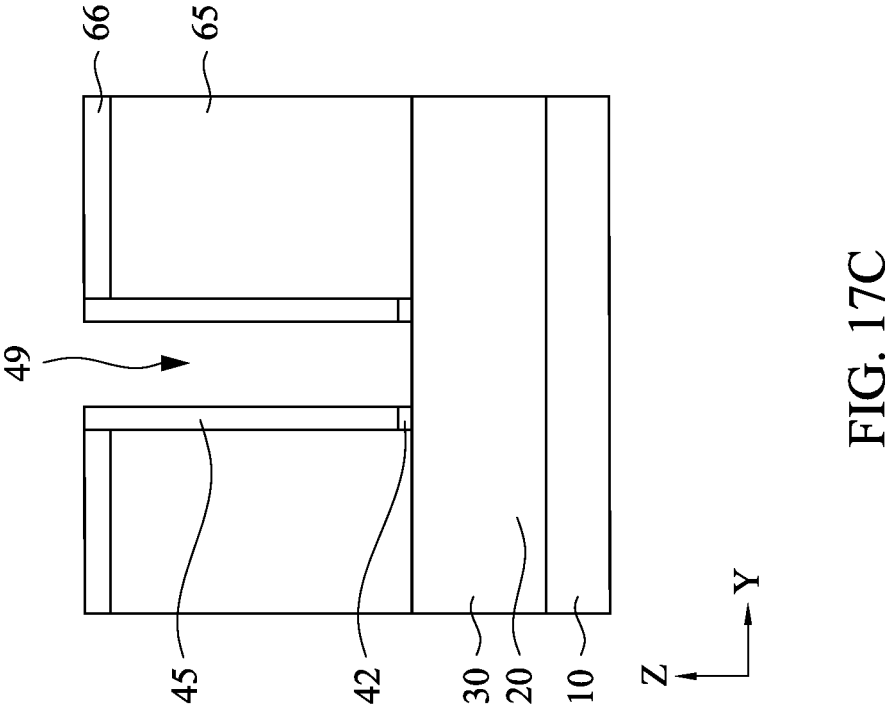

FIGS. 17A-17D show various view after the sacrificial gate structure (sacrificial gate electrode 44 and sacrificial gate dielectric layer 42) is removed, thereby forming a gate space 49, as described with FIG. 12. FIG. 17A is a cross sectional view along X1-X1 of FIG. 17D (a plan or projected view), FIG. 17B is a cross sectional view along Y1-Y1 of FIG. 17D and FIG. 17C is a cross sectional view along Y2-Y2 of FIG. 17D. In some embodiments, an additional dielectric layer 66 is formed over the ILD layer 65. In some embodiments, the additional dielectric layer 66 includes silicon nitride.

Figure 18B:
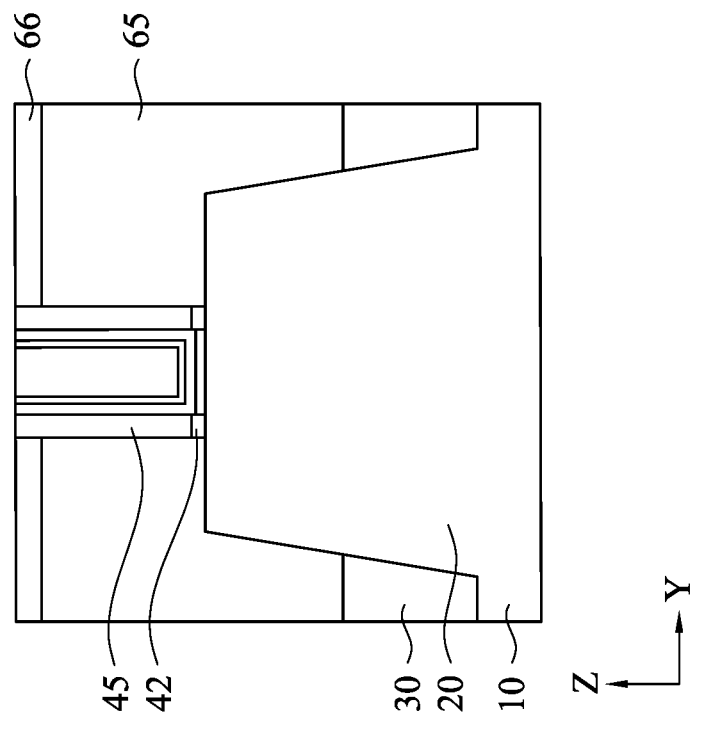
FIGS. 18A, 18B and 18C show various stages of a sequential process for a gate replacement operation according to an embodiment of the present disclosure.
Figure 18A:
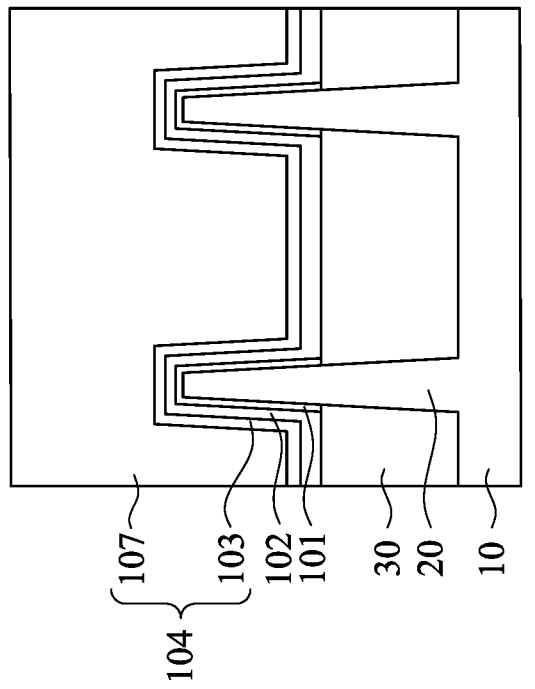
Figure 18C:
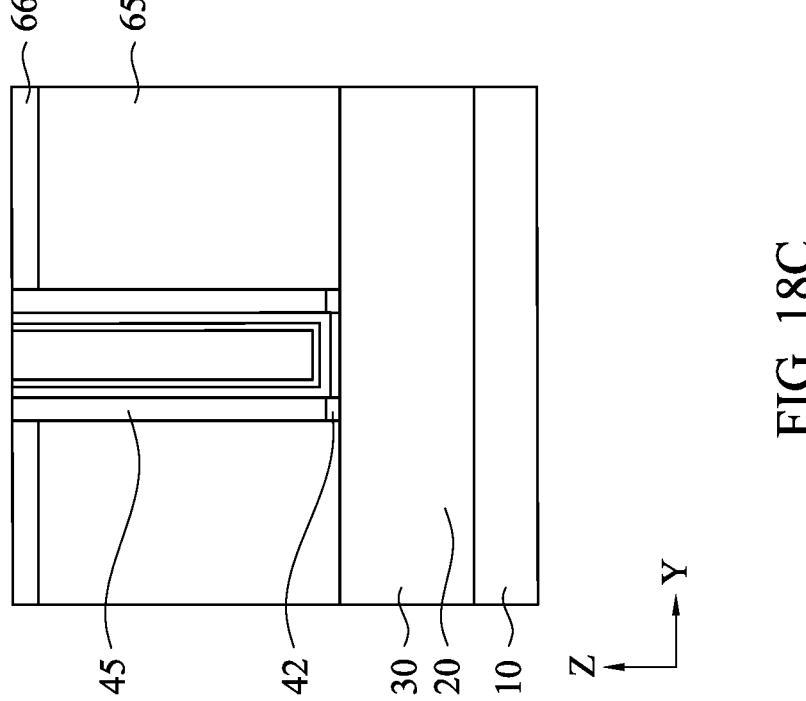

Then, as shown in FIGS. 18A-18C, an interfacial layer 101 is formed on the channel regions of the fin structures 20 and a gate dielectric layer 102 is formed over the interfacial layer and inner wall of the gate sidewall spacers 45. Then, one or more work function adjustment layers 103 are formed on the gate dielectric layer 102, and a body metal gate electrode layer 107 is formed over the work function adjustment layer 103. In some embodiments, a glue layer is formed between the work function adjustment layer and the body metal gate electrode layer 107. In some embodiments, the FinFET shown in FIGS. 18A-18C is an n-type FET and the work function adjustment layer 103 is an n-type work function adjustment layer (e.g., TiAl or TiAlC).

Figure 19B:
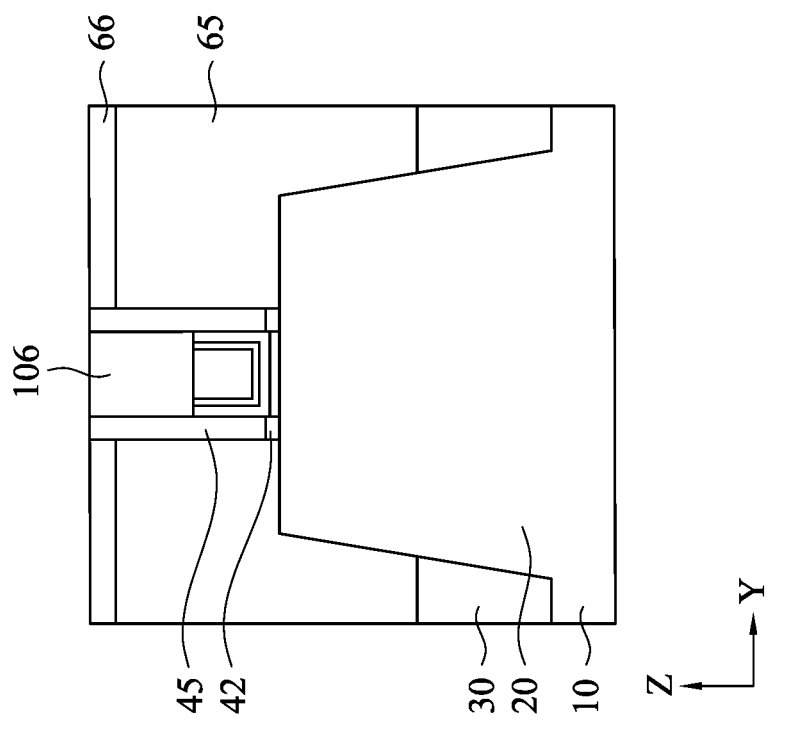
FIGS. 19A, 19B and 19C show various stages of a sequential process for a gate replacement operation according to an embodiment of the present disclosure.
Figure 19B:
Figure 19A:
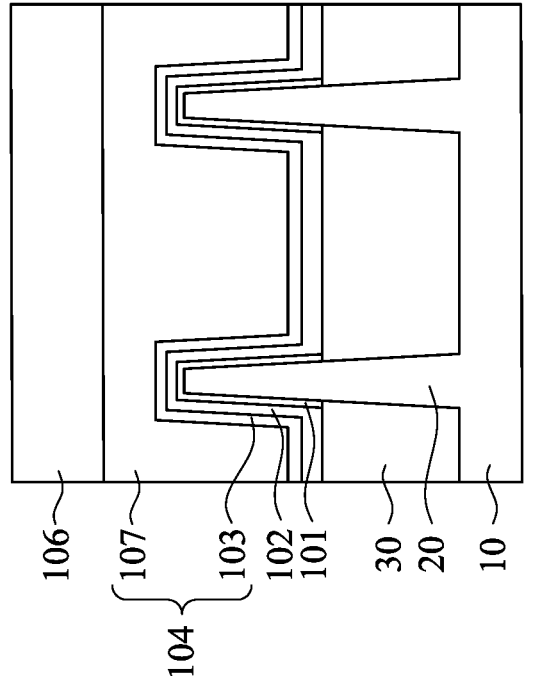
Figure 19C:
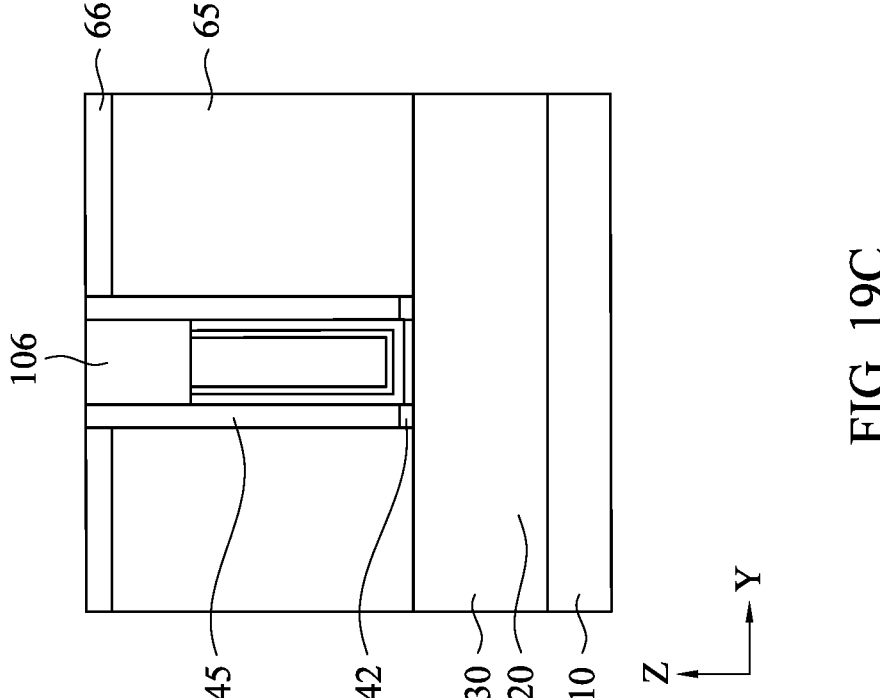
Figure 20B:
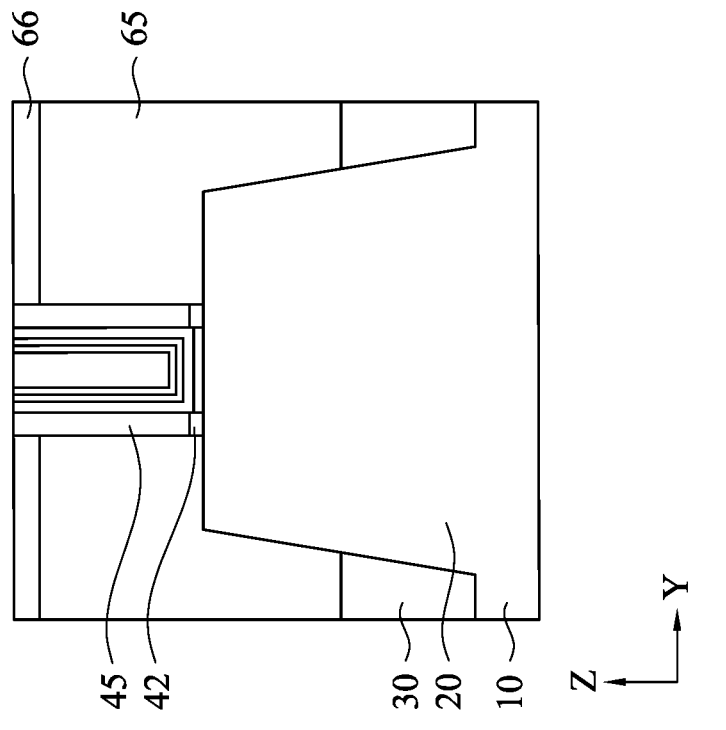
FIGS. 20A, 20B and 20C show various stages of a sequential process for a gate replacement operation according to an embodiment of the present disclosure.
Figure 20A:
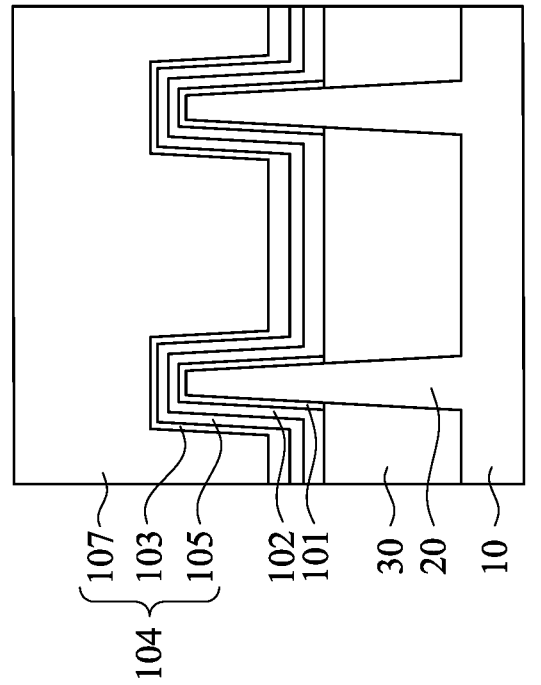
Figure 20C:
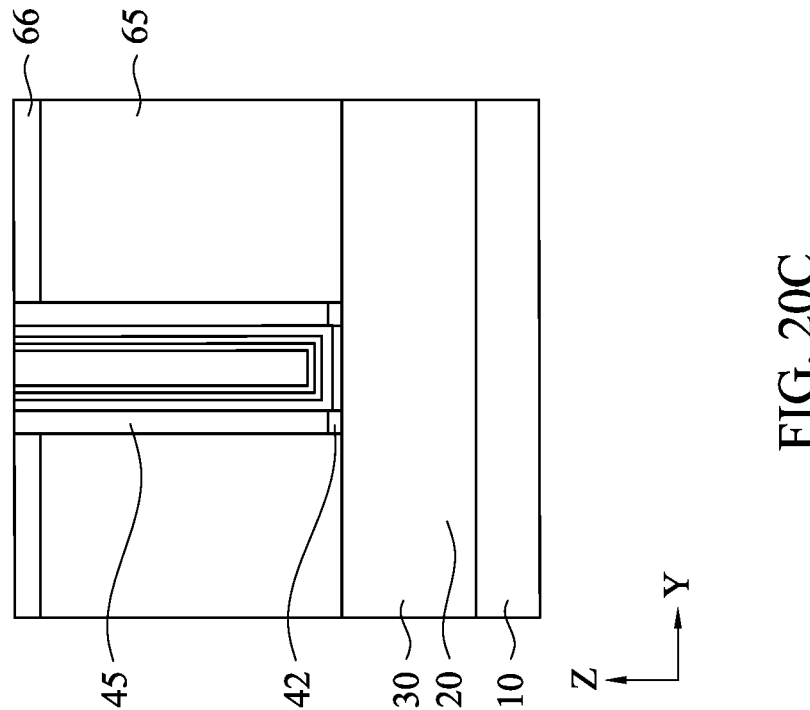
Figure 21B:
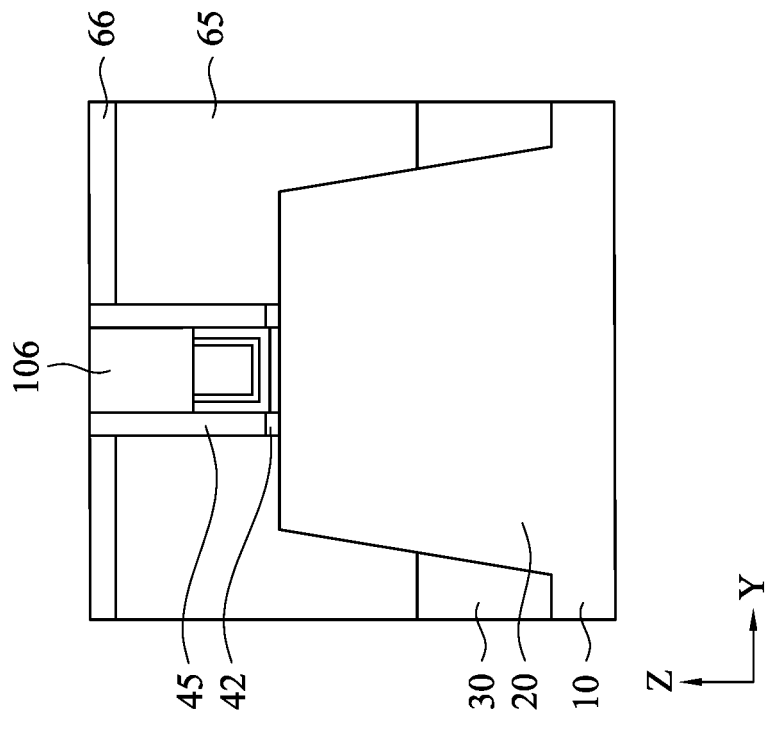
FIGS. 21A, 21B and 21C show various stages of a sequential process for a gate replacement operation according to an embodiment of the present disclosure.
Figure 21A:
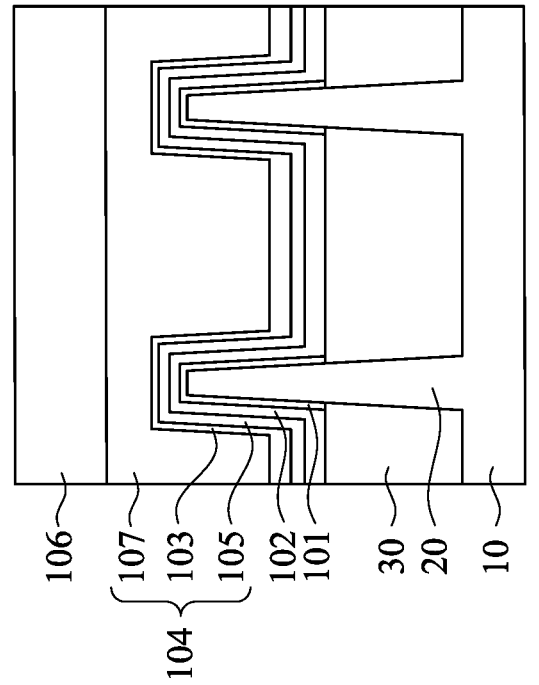
Figure 21C:
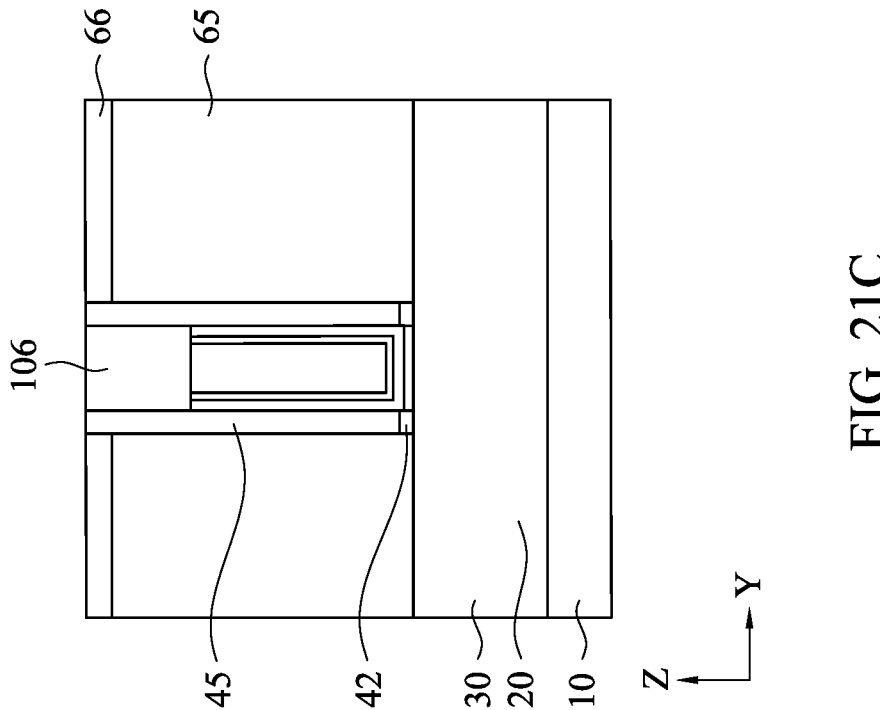

Further, as shown in FIGS. 19A-19C, the metal gate structure including the metal gate electrode 104 and the gate dielectric layer 102 are recessed down to a desired level, thereby forming a gate recess space, and the gate recess space is filled with an insulating material 106. In some embodiments, the gate cap insulating layer 106 includes silicon nitride, SiON and/or SiOCN or any other suitable material.

FIGS. 20A-20C and 21A-21C are the case for p-type FET. In some embodiments, one or more p-type work function adjustment layers 105 (e.g., Ti, or TiN) are formed on the gate dielectric layer 102 and the n-type work function adjustment layer 103 is formed on the p-type work function adjustment layer 105. In some embodiments, a glue layer is formed between the work function adjustment layer and the body metal gate electrode layer 107.

Generally, an n-type FinFET and a p-type FinFET are formed in one device. Further, in some embodiments, gate lengths (widths along the Y direction) are different for different types (conductivity and/or threshold voltage) of FETs. The gate recess etching is performed on both an n-type metal gate structure and a p-type metal gate structure and/or different gate length structures. In such a case, due to the different metal structures and/or the different lengths, the height of the recessed metal gate structure would vary. When the recessed metal gate structure is higher than the desired level (less etching), electric separation between the metal gate electrode and the adjacent contact (e.g., a contact on a source/drain epitaxial layer) may be insufficient, and when the recessed metal gate structure is lower than the desired level (more etching), the etching may damage on the underlying fin structure (channel region).

Figure 22B:
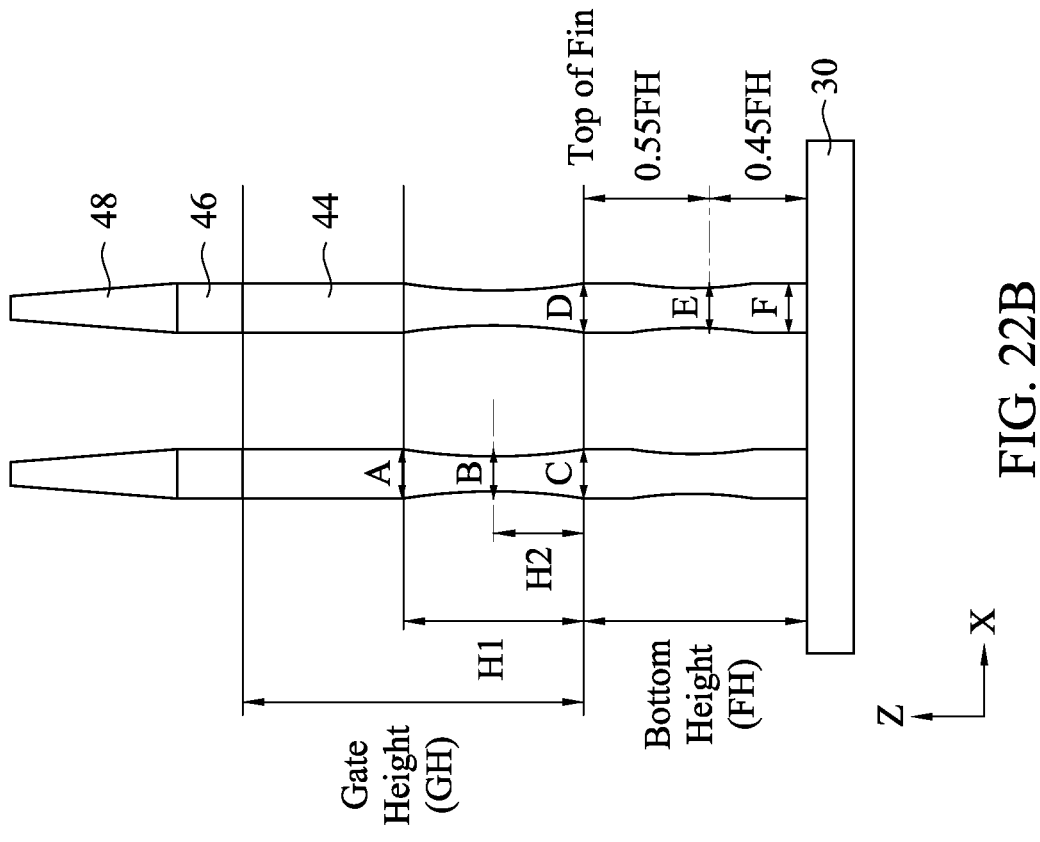
FIGS. 22A and 22B show a profile of a sacrificial gate electrode according to an embodiment of the present disclosure.
Figure 22A:
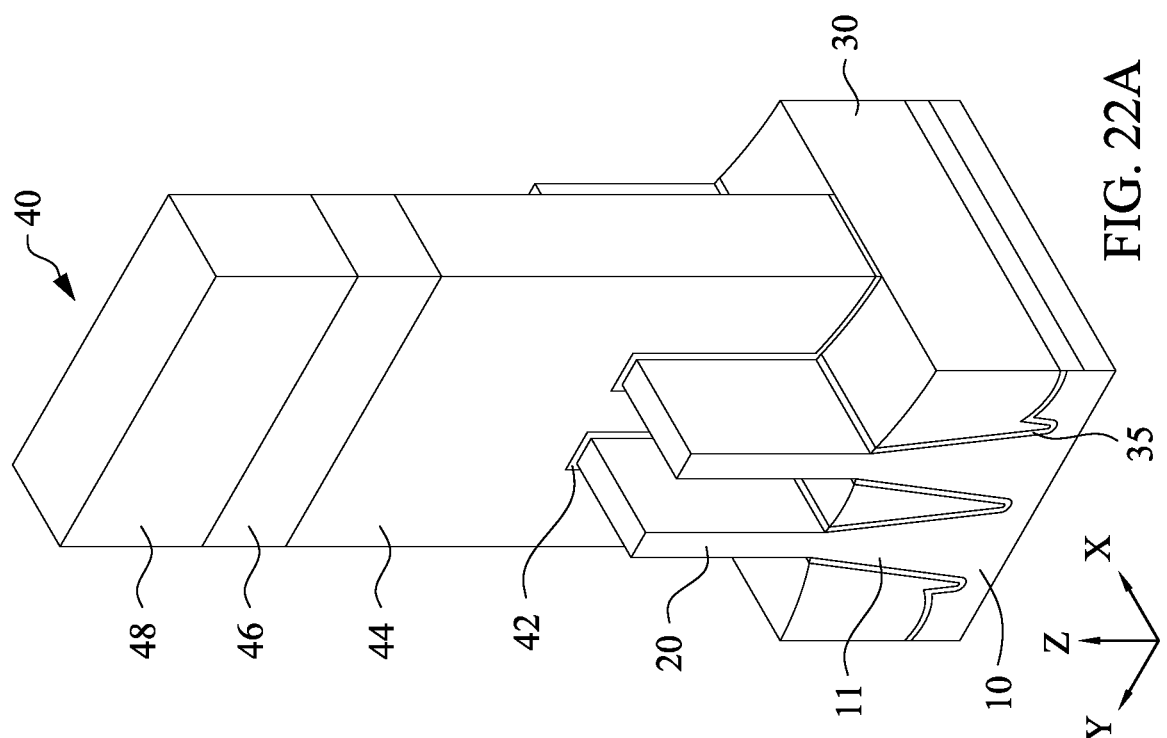

In view of the foregoing issue, in the present disclosure, the profile of the sacrificial gate electrode 44 is adjusted to have a narrow portion above the fin top area, as shown in FIGS. 22A and 22B.

FIG. 22A is the same as FIG. 7 and shows the patterned sacrificial gate electrode 44 with the hard mask layers 46 and 48. FIG. 22B shows a pattern profile of the sacrificial gate electrode 44 with the hard mask layers 46 and 48. Although FIG. 22A shows one sacrificial gate electrode and FIG. 22B shows two for purpose of explanation, the numbers of the sacrificial gate electrodes is not limited to one or two.

The sacrificial gate electrode 44 has a lower portion (FH) lower than the top of the fin structure 20, an upper portion (GH) higher than the top of the fin structures 20, and the hard mask layers 46 and 48. In some embodiments the lower portion has a vertical length FH from the surface of the isolation insulating layer 30 and the level of the top of the fin structure 20 (i.e., the height of the channel region of upper portion of the fin structure 20 protruding from the isolation insulating layer) and the upper portion has a vertical length GH. In some embodiments, GH is in a range from about 1.5FH to 3FH.

In the present disclosure, by controlling one or more etching conditions of the sacrificial gate etching, the profile of the sacrificial gate electrode 44 above the top of the fin structure 20 is adjusted. The width A shown in FIG. 22B is measured at the level H1 of 20% of GH from the top of the fin structure 20 and the width C is measured at the level of the top of the fin structure 20. The width B is a narrowest width within the height H1, and in some embodiments, corresponds to a level H2 of about 5-15% of the GH from the top of the fin structure 20.

As shown in FIG. 22A, the region corresponding to height H1 (narrow portion) of the sacrificial gate electrode has an inverted spindle (inverted pincushion) shape. The widths A and C are greater than width B in some embodiments. In some embodiments, the width B is the narrowest. In some embodiments, a ratio B/C is about 0.5 to about 0.9 and in other embodiments, the ratio B/C is about 0.6 to about 0.8. If the ratio is too small, the minimum width of the gate space is too small to fully fill the gate space with one or more conductive layer, and if the ratio is too large, the height of the recessed metal gates may not be the same.

In some embodiments, as shown in FIG. 22B, the lower portion (FH) of the sacrificial gate electrode 44 also has an inverted spindle (inverted pincushion) shape. The width D is greater than widths E and F and width E is smaller than width F. In some embodiments, width E is about 7-9% smaller than width D (0.91-0.93 of width D), and width F is about 5-6% smaller than width D, depending of device performance requirements. In some embodiments, the lower portion of the sacrificial gate electrode has a reverse tapered shape where width F is smaller than width E which is smaller than width D. In some embodiments, the narrowest portion is located at the level of about 0.4FH to about 0.5FH from the upper surface of the isolation insulating layer 30.

As explained below, the shape of the sacrificial gate electrode 44 corresponds to the shape of the metal gate electrode.

The shapes or profiles of the sacrificial gate electrode 44 is controlled by changing one or more of process conditions. The process conditions include pressure during the coating material formation, gas flow rates, gas flow ratios, and input electric power. In some embodiments, a gas ratio, for example, $HBr/Cl_2$, is changed during the etching. Generally, when the gas ratio $HBr/Cl_2$ is higher, more vertical etching progress, thereby causing larger CD, and when the gas ratio $HBr/Cl_2$ is lower, more horizontal etching progress, thereby causing smaller CD. In some embodiments, when the etching of the polysilicon layer reaches a certain level, for example, about 20% of GH from the top of the fin structure 20, the gas ratio $HBr/Cl_2$ is changed (lowered) to form a narrow portion. After the narrowest portion (width B) is formed, the gas ratio $HBr/Cl_2$ is changed (increased) in some embodiments. In some embodiments, the gas ratio $HBr/Cl_2$ for the smaller CD is in a range from about 1.0 to 2.0 and the gas ratio $HBr/Cl_2$ for the larger CD is in a range from about 2.5 to 3.5.

FIGS. 23A-23D show a sequential process for a gate replacement operation according to an embodiment of the present disclosure. It is understood that additional operations can be provided before, during, and after processes shown by FIGS. 23A-23D, and some of the operations described below can be replaced or eliminated, for additional embodiments of the method. The order of the operations/processes may be interchangeable. FIGS. 23A-23D show a metal gate forming process for an n-channel FET and p-channel FET.

Figure 23B:
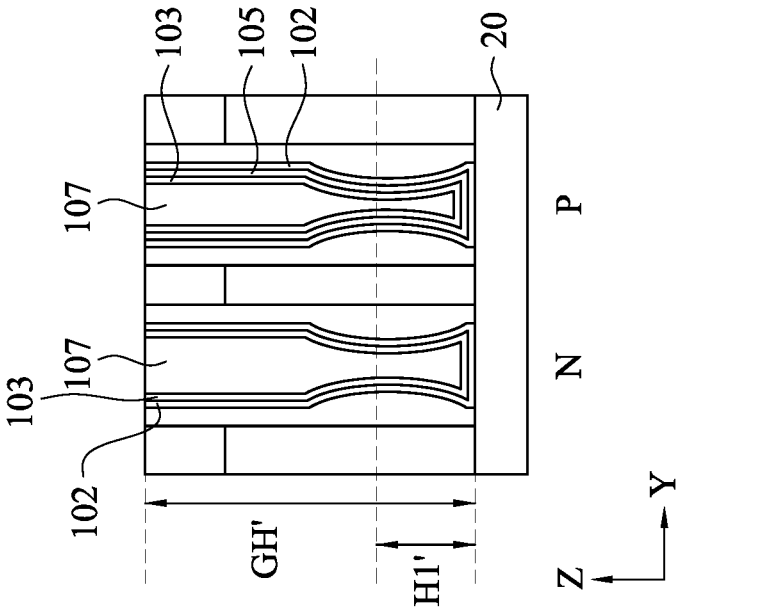
FIGS. 23A, 23B, 23C and 23D show various stages of a sequential process for a gate replacement operation according to an embodiment of the present disclosure.
Figure 23A:
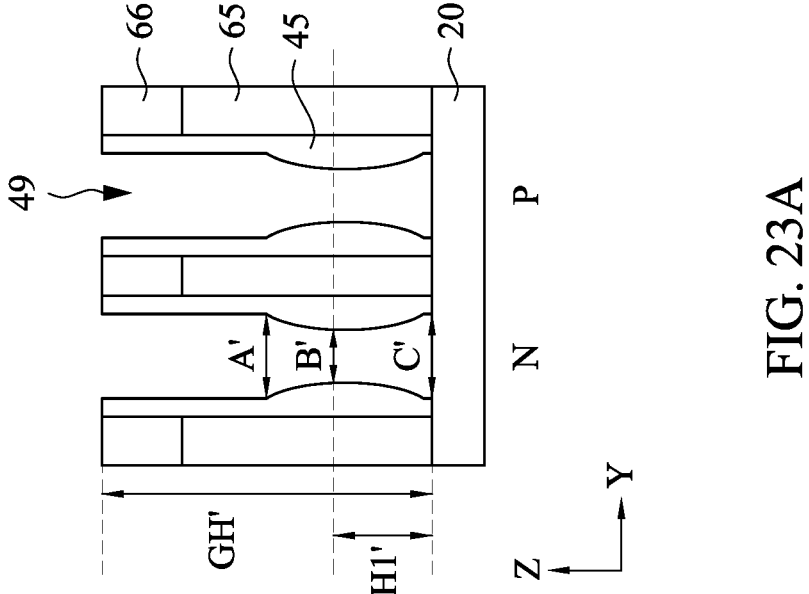

FIG. 23A shows a cross sectional view corresponding to Y1-Y1 of FIG. 17D after the sacrificial gate electrode 44 and the sacrificial gate dielectric layer 42 are removed. As shown in FIG. 23A, the gate space 49 is formed by the gate sidewall spacers 45, which reflects the profile (shape) of the sacrificial gate electrode 44. Within the range of H1' which is 20% of the depth of the gate space GH', the gate space 49 has a narrow portion. The height GH' is a distance from the top of the fin structure 20 (channel region) to the upper surface of the additional dielectric layer 66.

The width A' shown in FIG. 23A is measured at the level H1' of 20% of GH' from the top of the fin structure 20 and the width C' is measured at the level of the top of the fin structure 20. The width B' is a narrowest width within the height H1', and in some embodiments, corresponds to a level of about 5-15% of the GH' from the top of the fin structure 20.

As shown in FIG. 23A, the region corresponding to height H1' (narrow portion) of the depth of the gate space GH' has an inverted spindle (inverted pincushion) shape. The widths A' and C' are greater than width B' in some embodiments. In some embodiments, the width B' is the narrowest. In some embodiments, a ratio B'/C' is about 0.5 to about 0.9 and in other embodiments, the ratio B'/C' is about 0.6 to about 0.8. The dimensions H1', A', B' and C' of the gate space are substantially the same as dimensions H1, A, B and C of the sacrificial gate electrode 44 in some embodiments.

As shown in FIG. 23B, a gate dielectric layer 102 is formed on an interfacial layer (not shown in FIGS. 23B-23D), and one or more work function adjustment layers 103 and 105 are formed over the gate dielectric layer 102. Further, a body metal gate electrode layer 107 are formed over the one or more work function adjustment layers 103 and 105, and a planarization operation, such as a CMP process, is performed to obtain the structure of FIG. 23B.

Figure 23D:
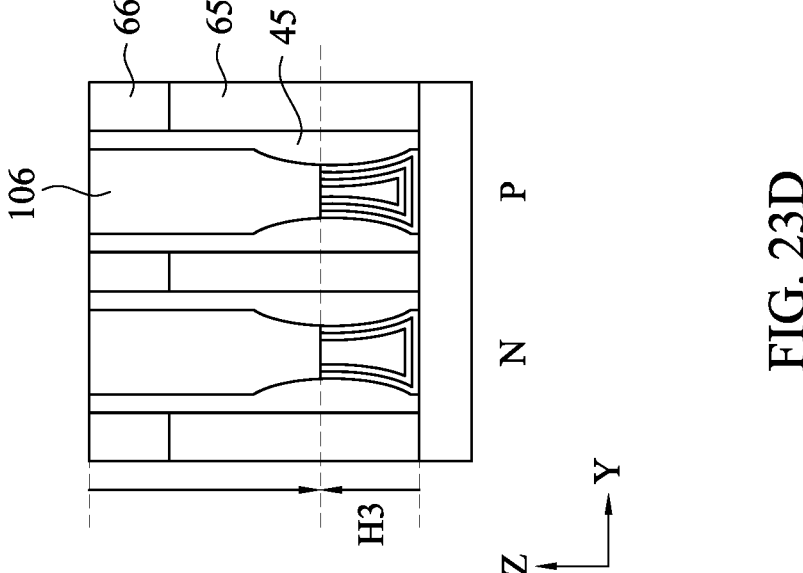
Figure 23C:
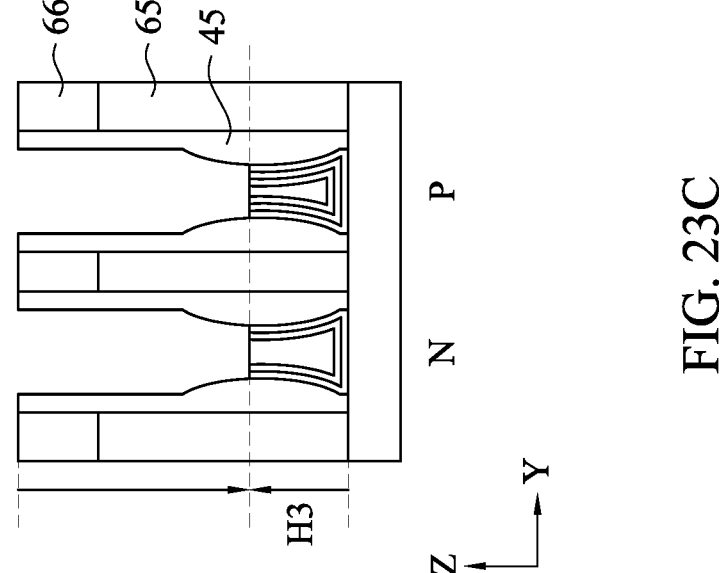

Then, as shown in FIG. 23C, the top or the metal gate structure is recessed. When the etching progresses downwardly and reaches the narrow portion, the etching rate decreases due to the narrowness of the gate structure. The slower etching rate contributes to the balancing the etching amount of different metal layer structures. Accordingly, the remaining heights H3 of the metal gate structures for the n-type FET and the p-type FET are substantially the same. In some embodiments, the height difference between the recessed metal gate structures for the n-type FET and the p-type FET is in a range from about 0.1 nm to about 2 nm. In some embodiments, when the top of the recessed metal gate structures is not flat, the height is defined as the average height of the body metal gate electrode 107. The etching is stopped at a middle of the narrow portion as shown in FIG. 23C in some embodiments. In some embodiments, the remaining height H3 is about 40% to about 60% of H1'. Then, as shown in FIG. 23D, a gate cap insulating layer 106 is formed.

Although FIGS. 23A-23D shows an n-type gate electrode and a p-type gate electrode are disposed over one fin structure, in other embodiments, an n-type gate electrode and a p-type gate electrode are disposed over different fin structures. Further, in other embodiments, one sacrificial gate electrode is formed over two or more fin structures, and a p-type gate electrode and an n-type gate electrode are formed in one gate space corresponding to the one sacrificial gate electrode.

Figure 24:
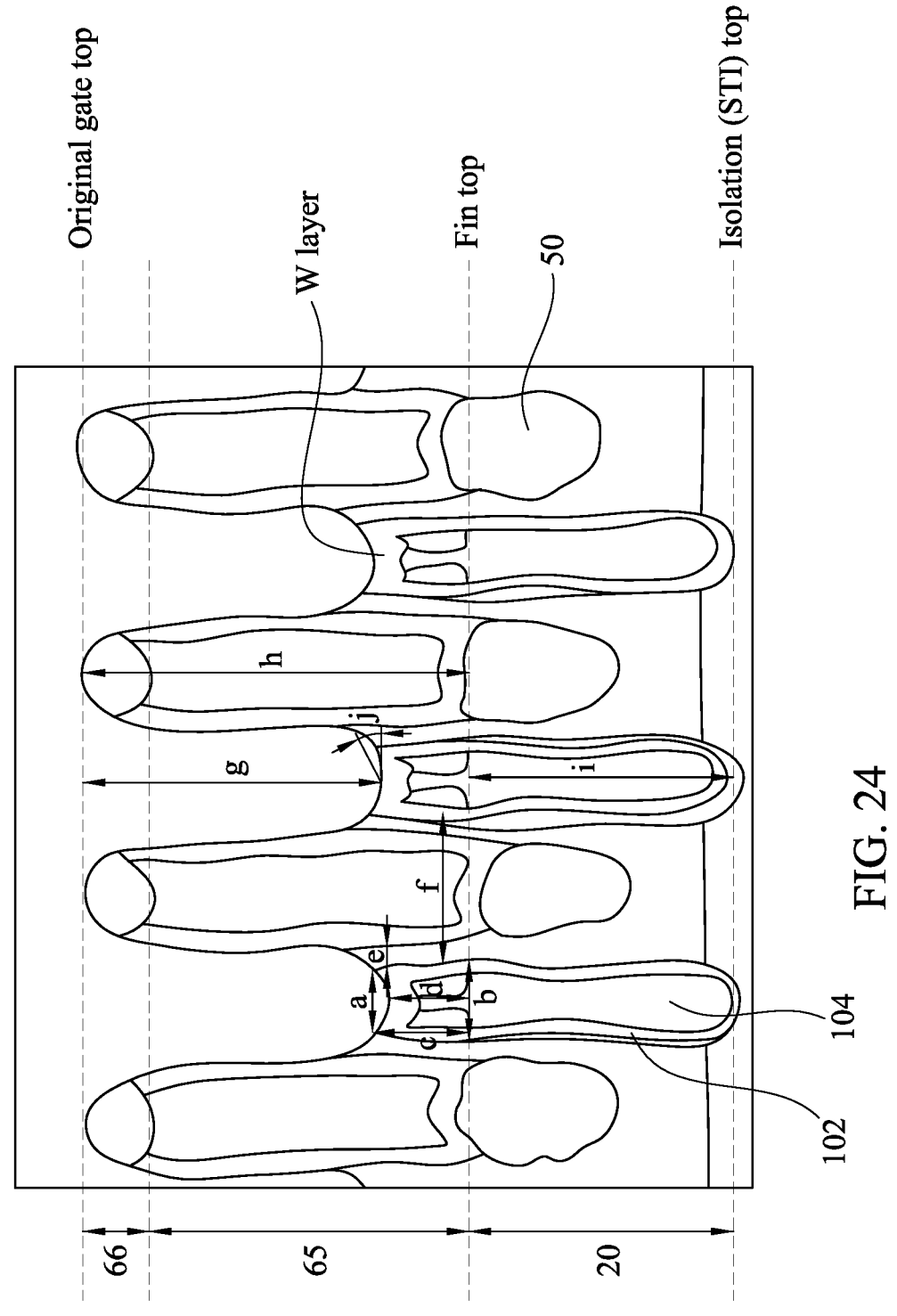
FIG. 24 shows a cross sectional view of a metal gate structure according to an embodiment of the present disclosure.

FIG. 24 shows a cross sectional view of the metal gate electrodes according to an embodiments of the present disclosure.

As shown in FIG. 24, the metal gate structure has an upper portion above the level of the top of the fin structure (channel region) and a lower portion between the level of the top of the fin structure and the upper surface of the isolation insulating layer. In some embodiments, the upper portion has a tapered shape having a width gradually decreasing toward the top of the metal gate. In some embodiments, the lower portion has an inverted spindle (inverted pincushion) shape.

In FIG. 24, a dimension "a" is a width of the top of the metal gate electrode. In some embodiments, the width "a" is in a range from about 10 nm to about 14 nm to obtain an etching rate slow-down effect. A dimension "b" is a width of the metal gate electrode at the level of the top of the fin structure 20. In some embodiments, the width "b" is in a range from about 13 nm to about 20 nm to avoid a seam or a void in the metal gate electrode. Further, to avoid a seam or a void in the metal gate electrode, the ratio a/b is set in a range from about 0.5 to about 0.9 in some embodiments, and in other embodiments, the ratio a/b is about 0.6 to about 0.8.

A dimension "c" is a height of the gate dielectric layer above the level of the top of the fin structure. In some embodiments, the height "c" is in a range from about 6 nm to about 40 nm to obtain sufficient separation between the metal gate electrode and a contact on the source/drain epitaxial layer 50. A dimension "d" is a height of the gate electrode layer above the level of the top of the fin structure. In some embodiments, the height "d" is in a range from about 6 nm to about 40 nm to obtain sufficient separation between the metal gate electrode and the contact on the source/drain epitaxial layer 50 and to avoid damage on the fin structure (channel region). Further, to avoid a short-circuit between the metal gate electrode and the contact on the source/drain epitaxial layer 50, the ratio c/d is set in a range from about 0.5 to about 2.0 in some embodiments, and in other embodiments, the ratio c/d is about 0.8 to about 1.2. In some embodiments, c>d.

A dimension "e" is a width of a gate sidewall spacer. In some embodiments, the width "e" is in a range from about 5 nm to about 13 nm to avoid ILD loss during the etching operation.

A dimension "f" is a space between adjacent metal gate structures at the level of the top of the fin structure. In some embodiments, the space "f" is in a range from about 20 nm to about 30 nm.

A dimension "g" is a recessed amount (depth) corresponding to GH' shown in FIG. 23A. In some embodiments, the depth "g" is in a range from about 40 nm to about 75 nm depending on the device or process requirements. A dimension "h" is a height of the top of the ILD layer including the additional dielectric layer 66 from the top of the fin structure, and is substantially equal to d+g. In some embodiments, the ratio h/d is in a range from about 2.0 to about 8.0 nm to obtain sufficient process margin when forming the contact to the source/drain epitaxial layer.

A dimension "i" is a fin height from the upper surface of the isolation insulating layer. In some embodiments, the ratio d/i is in a range from about 0.1 to about 0.7 depending on the device or process requirements.

Further, in some embodiments, the top of the metal gate electrode (e.g., W layer) has a V-shape cross section as shown in FIG. 24. In some embodiments, an angle "j" is in a range from about 1 degree to about 45 degrees.

The various embodiments or examples described herein offer several advantages over the existing art. In the embodiments of the present disclosure, the profile (shape) of the etched polysilicon layer (sacrificial gate electrode layer) is adjusted to have a narrow portion above the top of the fin structure (channel region). By controlling the profile of the polysilicon pattern (sacrificial gate electrode), it is possible to control the etching rate uniformity between different metal gate structures, which can improve device performance and yield.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure protruding from an isolation insulating layer disposed over a substrate is formed, a sacrificial gate dielectric layer is formed over the fin structure, a polysilicon layer is formed over the sacrificial gate dielectric layer, a mask pattern is formed over the polysilicon layer, and the polysilicon layer is patterned into a sacrificial gate electrode using the mask pattern as an etching mask. The sacrificial gate electrode has a narrow portion above a level of a top of the fin structure such that a width of the sacrificial gate electrode decreases, takes a local minimum, and then increases from the top of the fin structure. In one or more of the foregoing and following embodiments, a width $W1$ of the sacrificial gate electrode at the level of the top of the fin structure and a width $W2$ of the local minimum satisfy $0.5 \leq W2/W1 \leq 0.9$. In one or more of the foregoing and following embodiments, the sacrificial gate electrode includes a lower portion below the level of the top of the fin structure and above an upper surface of the isolation insulating layer, and the lower portion has an inverted spindle shape. In one or more of the foregoing and following embodiments, the patterning the polysilicon layer comprises a plasm dry etching using HBr gas and $Cl_2$ gas, and a gas ratio $HBr/Cl_2$ is changed to form the narrow portion. In one or more of the foregoing and following embodiments, a gas ratio $HBr/Cl_2$ is reduced when etching of the polysilicon layer reaches a predetermined level. In one or more of the foregoing and following embodiments, further, gate sidewall spacers are formed, a source/drain structure including an epitaxial semiconductor layer is formed, an interlayer dielectric layer is formed, the sacrificial gate electrode and sacrificial gate dielectric layer are removed, a gate dielectric layer and a gate electrode layer including one or more conductive material layers are formed, the gate dielectric layer and the gate electrode layer are recessed, and an insulating cap layer is formed over the recessed gate dielectric layer and the recessed gate electrode layer. In one or more of the foregoing and following embodiments, a height $H1$ of the recessed gate electrode layer from the level of the top of the fin structure and a height $H2$ of the recessed gate electrode layer from the isolation insulating layer satisfy $0.1 \leq H1/H2 \leq 0.7$.

In accordance with another aspect of the present disclosure, in a method of manufacturing a semiconductor device, a fin structure protruding from an isolation insulating layer disposed over a substrate is formed, a first sacrificial gate structure and a second sacrificial gate structure are formed over the fin structure, gate sidewall spacers are formed on sidewalls of each of the first sacrificial gate electrode and the second sacrificial gate electrode, an interlayer dielectric layer is formed, a first gate space is formed by removing the first sacrificial gate structure and a second gate space is formed by removing the second sacrificial gate structure, a gate dielectric layer is formed in the first and second gate space, a first gate electrode layer including one or more conductive material layers is formed over the gate dielectric layer in the first gate space and a second gate electrode layer including one or more conductive material layers is formed over the gate dielectric layer in the second gate space, the gate dielectric layer and the first gate electrode layer are recessed and the gate dielectric layer and the second gate electrode layer are recessed, and a first insulating cap layer is formed over the recessed gate dielectric layer and the first recessed gate electrode layer and a second insulating cap layer is formed over the recessed gate dielectric layer and the second recessed gate electrode layer. Each of the first gate space and the second gate space has a narrow portion above a level of a top of the fin structure such that a width of each of the first and second gate spaces decreases, takes a local minimum, and then increases from the top of the fin structure. In one or more of the foregoing and following embodiments, a number of the one or more conductive material layers of the first gate electrode is different from a number of the one or more conductive material layers of the second gate electrode. In one or more of the foregoing and following embodiments, a difference of a height of the first recessed gate electrode layer and a height of the second recessed gate electrode layer is in a range from 0.1 nm to 2 nm. In one or more of the foregoing and following embodiments, a width W1 of the each of the first and second gate spaces at the level of the top of the fin structure and a width W2 of the local minimum satisfy $0.6 \leq W2/W1 \leq 0.8$. In one or more of the foregoing and following embodiments, the forming the sacrificial gate structure comprises forming a sacrificial gate electrode by patterning a polysilicon layer by using a plasm dry etching using HBr gas and $Cl_2$ gas, and a gas ratio $HBr/Cl_2$ is changed during the plasma dry etching. In one or more of the foregoing and following embodiments, a gas ratio $HBr/Cl_2$ is reduced when etching of the polysilicon layer reaches a predetermined level. In one or more of the foregoing and following embodiments, each of the first and second sacrificial gate electrodes includes a lower portion below the level of the top of the fin structure and above an upper surface of the isolation insulating layer, and the lower portion has an inverted spindle shape.

In accordance with another aspect of the present disclosure, a semiconductor device includes a fin structure protruding from an isolation insulating layer disposed over a substrate and having a channel region, a source/drain region disposed over the substrate, a gate dielectric layer disposed on the channel region, and a gate electrode layer disposed on the gate dielectric layer. The gate electrode includes an upper portion above a level of a top of the channel region and a lower portion below the level of the top of the channel region and above an upper surface of the isolation insulating layer, and a width of the upper portion decreases from the top of the fin structure. In one or more of the foregoing and following embodiments, a width W1 of the upper portion at the level of the top of the fin structure and a width W2 of a top of the gate electrode layer satisfy $0.5 \leq W2/W1 \leq 0.8$. In one or more of the foregoing and following embodiments, a top of the gate dielectric layer is located at a different level than a top of the gate electrode layer. In one or more of the foregoing and following embodiments, a height H1 of the upper portion from the level of the top of the fin structure and a height H2 of the lower portion from the isolation insulating layer satisfy $0.1 \leq H1/H2 \leq 0.7$. In one or more of the foregoing and following embodiments, a top of the upper portion has a V-shape cross section. In one or more of the foregoing and following embodiments, the lower portion has an inverted spindle shape.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:

forming a fin structure protruding from an isolation insulating layer disposed over a substrate;

forming a sacrificial gate dielectric layer over the fin structure;

forming a polysilicon layer over the sacrificial gate dielectric layer;

forming a mask pattern over the polysilicon layer; and patterning the polysilicon layer into a sacrificial gate electrode using the mask pattern as an etching mask, wherein:

the sacrificial gate electrode has an upper portion above a level of a top of the fin structure and a lower portion below the level of the top of the fin structure, and the lower portion has an inverted spindle shape.

2. The method of claim 1, wherein a width W1 of the sacrificial gate electrode at the level of the top of the fin structure and a width W2 of a local minimum satisfy $0.5 \leq W2/W1 \leq 0.9$.

3. The method of claim 1, wherein a height GH of the upper portion is 1.5 times to 3 times a height FH of the lower portion.

4. The method of claim 1, wherein:

the patterning the polysilicon layer comprises a plasma dry etching using HBr gas and $Cl_2$ gas, and a gas ratio $HBr/Cl_2$ is changed to form a narrow portion.

5. The method of claim 4, wherein the gas ratio $HBr/Cl_2$ is reduced during the etching of the polysilicon layer.

6. The method of claim 1 further comprising:

forming gate sidewall spacers;

forming a source/drain structure including an epitaxial semiconductor layer;

forming an interlayer dielectric layer;

removing the sacrificial gate electrode and the sacrificial gate dielectric layer;

forming a gate dielectric layer and a gate electrode layer including one or more conductive material layers;

recessing the gate dielectric layer and the gate electrode layer; and forming an insulating cap layer over the recessed gate dielectric layer and the recessed gate electrode layer.

7. The method of claim 6, wherein a height H1 of the recessed gate electrode layer from the level of the top of the fin structure and a height H2 of the recessed gate electrode layer from the isolation insulating layer satisfy $0.1 \leq H1/H2 \leq 0.7$.

8. A method of manufacturing a semiconductor device, comprising:

forming a fin structure protruding from an isolation insulating layer disposed over a substrate;

forming a first sacrificial gate structure and a second sacrificial gate structure over the fin structure;

forming gate sidewall spacers on sidewalls of each of the first sacrificial gate structure and the second sacrificial gate structure;

forming an interlayer dielectric layer;

forming a first gate space by removing the first sacrificial gate structure and forming a second gate space by removing the second sacrificial gate structure;

forming a gate dielectric layer in the first and second gate space;

forming a first gate electrode layer including one or more conductive material layers over the gate dielectric layer in the first gate space and forming a second gate electrode layer including one or more conductive material layers over the gate dielectric layer in the second gate space;

recessing the gate dielectric layer and the first gate electrode layer and recessing the gate dielectric layer and the second gate electrode layer; and forming a first insulating cap layer over the recessed gate dielectric layer and the first recessed gate electrode layer and a second insulating cap layer over the recessed gate dielectric layer and the second recessed gate electrode layer, wherein:

the forming the first sacrificial gate structure and the second sacrificial gate structure comprises forming sacrificial gate electrodes by patterning a polysilicon layer by using a plasma dry etching using HBr gas and $Cl_2$ gas, and a gas ratio $HBr/Cl_2$ is changed during the plasma dry etching.

9. The method of claim 8, wherein a number of the one or more conductive material layers of the first gate electrode is different from a number of the one or more conductive material layers of the second gate electrode.

10. The method of claim 8, wherein the first insulating cap layer includes a portion of which width decreases toward the first recessed gate electrode layer.

11. The method of claim 8, wherein a width W1 of the each of the first and second gate spaces at the level of the top of the fin structure and a width W2 of a local minimum satisfy $0.6 \leq W2/W1 \leq 0.8$.

12. The method of claim 8, wherein the gas ratio $HBr/Cl_2$ is reduced during etching of the polysilicon layer.

13. The method of claim 8, wherein each of the first gate space and the second gate space has a narrow portion above a level of a top of the fin structure such that a width of each of the first and second gate spaces decreases, has a local minimum, and then increases from the top of the fin structure.

14. The method of claim 8, wherein:

each of the first and second sacrificial gate electrodes includes a lower portion below the level of the top of the fin structure and above an upper surface of the isolation insulating layer, and the lower portion has an inverted spindle shape.

15. A semiconductor device, comprising:

a fin structure protruding from an isolation insulating layer disposed over a substrate and having a channel region;

a source/drain region disposed over the substrate;

a gate dielectric layer disposed on the channel region;

a gate electrode layer disposed on the gate dielectric layer; and a cap insulating layer disposed on the gate electrode layer, wherein:

the gate electrode layer over the channel region has a width decreasing from a top of the channel region, and the cap insulating layer includes a first portion having a constant width and a second portion of which width decreases toward the gate electrode layer, and the second portion is between the first portion and the gate electrode layer.

16. The semiconductor device of claim 15, wherein a width W1 of the gate electrode layer at the level of the top of the fin structure and a width W2 of a top of the gate electrode layer satisfy $0.5 \leq W2/W1 \leq 0.8$.

17. The semiconductor device of claim 15, wherein the cap insulating layer is made of SiON.

18. The semiconductor device of claim 15, wherein the constant width of the cap insulating layer is greater than a width of a top of the gate electrode layer.

19. The semiconductor device of claim 15, further comprising gate sidewall spacers disposed on sidewalls of the gate electrode layer and the cap insulating layer.

20. The semiconductor device of claim 19, wherein a thickness along a horizontal direction of each of the gate sidewall spacers changes along a vertical direction.

* * * * *